US010847568B2

(12) United States Patent
Sekine

(10) Patent No.: US 10,847,568 B2
(45) Date of Patent: Nov. 24, 2020

(54) IMAGE SENSOR AND METHOD OF DRIVING IMAGE SENSOR

(71) Applicant: Tianma Japan, Ltd., Kanagawa (JP)

(72) Inventor: Hiroyuki Sekine, Kawasaki (JP)

(73) Assignee: TIANMA JAPAN, LTD., Kanagawa (JP)

( * ) Notice: Subject to any disclaimer, the term of this patent is extended or adjusted under 35 U.S.C. 154(b) by 36 days.

(21) Appl. No.: 16/276,107

(22) Filed: Feb. 14, 2019

(65) Prior Publication Data

US 2019/0252454 A1    Aug. 15, 2019

(30) Foreign Application Priority Data

Feb. 15, 2018    (JP) .................................. 2018-025329

(51) Int. Cl.
*H01L 27/146* (2006.01)
*H01L 31/115* (2006.01)
*H04N 5/32* (2006.01)

(52) U.S. Cl.
CPC .. *H01L 27/14659* (2013.01); *H01L 27/14612* (2013.01); *H01L 31/115* (2013.01); *H04N 5/32* (2013.01)

(58) Field of Classification Search
None
See application file for complete search history.

(56) References Cited

U.S. PATENT DOCUMENTS

| 6,075,256 | A  | * | 6/2000  | Kaifu | ................... | G01T 1/2018 |
|-----------|----|---|---------|-------|---------------------|-------------|
|           |    |   |         |       |                     | 257/53      |
| 6,512,279 | B2 | * | 1/2003  | Kaifu | ................... | G01T 1/2018 |
|           |    |   |         |       |                     | 257/448     |
| 6,982,422 | B2 | * | 1/2006  | Kaifu | ................... | G01T 1/2018 |
|           |    |   |         |       |                     | 250/370.09  |
| 7,022,997 | B2 | * | 4/2006  | Kaifu | ................... | G01T 1/2018 |
|           |    |   |         |       |                     | 250/370.14  |
| RE39,780  | E  | * | 8/2007  | Kaifu | ................... | G01T 1/2018 |
|           |    |   |         |       |                     | 257/53      |
| 7,442,939 | B2 | * | 10/2008 | Yagi  | ....................| G01T 1/247  |
|           |    |   |         |       |                     | 250/370.11  |

(Continued)

FOREIGN PATENT DOCUMENTS

JP    04-180454 A    6/1992
JP    2011-085680 A    4/2011

*Primary Examiner* — Thomas R Artman
(74) *Attorney, Agent, or Firm* — Sughrue Mion, PLLC

(57) ABSTRACT

An image sensor: includes a pixel matrix in which pixels are disposed in a matrix, each pixel including a photoelectric conversion element and a switching element connected to the photoelectric conversion element; performs selection processing, on each pixel row of the pixel matrix, including selecting a pixel row and outputting a signal to the selected pixel row to make switching elements conductive; performs detection processing of detecting signals from the photoelectric conversion elements in the selected pixel row; and performs the selection processing based on received control signals, wherein the control signals include first control signals having a cycle shorter than a first period in which the selection processing and the detection processing are performed on all pixel rows, and wherein the cycle is equal to or shorter than a second period in which the selection processing and the detection processing are performed on one pixel row.

7 Claims, 13 Drawing Sheets

(56) References Cited

U.S. PATENT DOCUMENTS

| | | | | |
|---|---|---|---|---|
| 7,541,594 B2* | 6/2009 | Adachi | ............... | G01T 1/17 |
| | | | | 250/370.09 |
| 7,839,977 B2* | 11/2010 | Kameshima | ......... | A61B 6/4233 |
| | | | | 250/370.09 |
| RE42,157 E * | 2/2011 | Kaifu | ............... | G01T 1/2018 |
| | | | | 257/53 |
| 9,774,794 B2* | 9/2017 | Sakino | ............... | H04N 5/32 |
| 10,269,839 B2* | 4/2019 | Mruthyunjaya | ......... | H04N 5/32 |
| 2001/0050402 A1* | 12/2001 | Kaifu | ............... | G01T 1/2018 |
| | | | | 257/431 |
| 2002/0167061 A1* | 11/2002 | Kaifu | ............... | H01L 27/1214 |
| | | | | 257/431 |
| 2004/0159901 A1* | 8/2004 | Kaifu | ............... | G01T 1/2928 |
| | | | | 257/431 |
| 2006/0027758 A1* | 2/2006 | Kaifu | ............... | H01L 21/84 |
| | | | | 250/370.09 |
| 2007/0096032 A1* | 5/2007 | Yagi | ............... | G01T 1/247 |
| | | | | 250/370.11 |
| 2007/0120063 A1* | 5/2007 | Adachi | ............... | G01T 1/24 |
| | | | | 250/370.09 |
| 2014/0239189 A1* | 8/2014 | Sakino | ............... | G01T 1/247 |
| | | | | 250/394 |
| 2016/0284748 A1* | 9/2016 | Mruthyunjaya | .. | H01L 27/14692 |
| 2019/0252454 A1* | 8/2019 | Sekine | ............... | H01L 31/115 |

* cited by examiner

IMAGE SENSOR AND METHOD OF DRIVING IMAGE SENSOR

CROSS-REFERENCE TO RELATED APPLICATION

This Non-provisional application claims priority under 35 U.S.C. § 119(a) on Patent Application No. 2018-025329 filed in Japan on Feb. 15, 2018, the entire contents of which is hereby incorporated by reference.

BACKGROUND

The present disclosure relates to an image sensor and a method of driving an image sensor.

An image sensor in which pixels including a photoelectric conversion element and a switching element of a thin film transistor (TFT) are arrayed on a glass substrate can be used as an imager for transmitted X-rays. This is because it is difficult to configure a reduction optics for X-rays like the one for visible light, and therefore, an imager having the same size as the subject is required.

The image sensor used as X-ray imager reads out signals by taking out signal charges corresponding to the amounts of X-ray irradiation from the photoelectric conversion elements to the external. The signal charges can be taken out by making the TFTs in the pixels conductive.

For the TFTs to be used in image sensors, amorphous silicon (a-Si) or polysilicon (poly-Si) is employed; however, poly-Si is rarely used for X-ray imagers. This is because it is difficult to control the grain size in a poly-Si semiconductor thin film and accordingly, poly-Si TFTs have a large variation in threshold voltage caused by the difference in grain boundaries. The large variation in threshold voltage increases fixed pattern noise (FPN).

Meanwhile, TFTs made of amorphous oxide semiconductor represented by In—Ga—Zn—O (IGZO) have been energetically researched and developed in view of the advantages such as high current-driven capability and high uniformity in threshold voltage because they are amorphous thin film. As to both the a-Si TFTs and amorphous oxide semiconductor TFTs, however, no p-type semiconductor material having characteristics suitable for practical use has been found yet. Only the TFTs having the conductivity of n-type have been put into practical use.

In recent years, X-ray imaging has rapidly been shifted from imaging with an X-ray sensitive film to imaging with an image sensor; this trend has generated a strong demand for inexpensive image sensors. To lower the cost of image sensors, an approach of forming a scanning circuit on the sensor substrate has been brought. JP H04-180454 A discloses an image sensor including a TFT scanning circuit formed on a sensor substrate.

The image sensor according to JP H04-180454 A is a single-dimension image sensor in which pixels are disposed linearly and the scanning circuit for driving the gates of the TFTs of individual pixels is configured with TFTs. The scanning circuit in the image sensor according to JP H04-180454 A is a shift register including a ratio-type inverter and a transmission gate; it can be configured with only TFTs of a single conductivity type (n-type or p-type).

JP 2011-85680 A discloses a scanning circuit configured with only TFTs of a single conductivity type that work with small power consumption. The scanning circuit according to JP 2011-85680 A does not include a ratio-type inverter; electric current does not flow in the TFTs all the time. Although the scanning circuit according to JP 2011-85680 A is a scanning circuit for driving the gate lines of a liquid crystal display device, it is functionally the same as the scanning circuit for an image sensor.

SUMMARY OF THE INVENTION

The scanning circuit according to JP H04-180454 A including a ratio-type inverter has a problem of high power consumption because electric current flows between the voltage sources (between VDD and GND) all the time. Moreover, the current continuously flowing in the TFTs generates noise, raising another problem of reducing the S/N ratio of the image sensor.

The scanning circuit according to JP 2011-85680 A works with low power consumption and the current does not flow in the TFTs all the time. However, in the case where the scanning circuit according to JP 2011-85680 A is applied to an image sensor, fixed pattern noise (FPN) originated from the scanning circuit is generated.

An aspect of the present disclosure adopts the following structure order to solve the above problems. An image sensor includes: a pixel matrix in which pixels are disposed in a matrix, each pixel including a photoelectric conversion element and a switching element connected to the photoelectric conversion element; a scanning unit configured to serially perform selection processing on each pixel row of the pixel matrix, the selection processing including selecting a pixel row and outputting an output signal to the selected pixel row to make switching elements conductive; and a detector unit configured to perform detection processing of detecting signals from the photoelectric conversion elements in the selected pixel row, wherein the scanning unit is configured to: receive input of a plurality of control signals; and perform the selection processing on each pixel row based on the plurality of control signals, wherein the plurality of control signals include short-cycle control signals having a cycle shorter than a first period in which the selection processing and the detection processing are performed on all pixel rows, and wherein the cycle of the short-cycle control signals is equal to or shorter than a second period in which the selection processing and the detection processing are performed on one pixel row.

It is to be understood that both the foregoing general description and the following detailed description are exemplary and explanatory and are not restrictive of this disclosure.

BRIEF DESCRIPTION OF THE DRAWINGS

The present disclosure can be appreciated by the description which follows in conjunction with the following figures, wherein.

EMBODIMENTS

Figure 1:
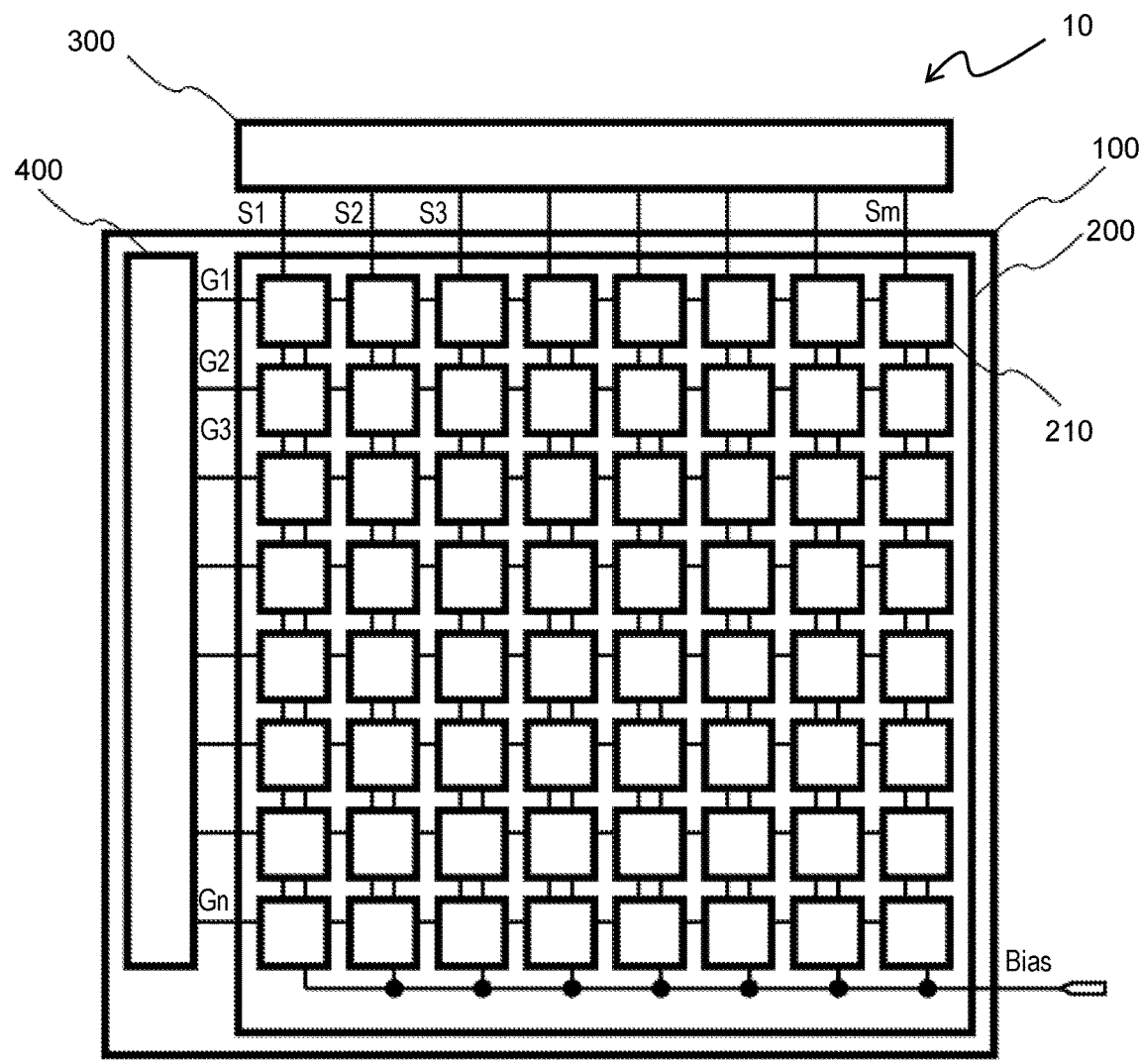
FIG. 1 is a block diagram illustrating a configuration example of an image sensor according to Embodiment 1.

Hereinafter, embodiments are described with reference to the accompanying drawings. It should be noted that the embodiments are merely examples to implement this disclosure and are not to limit the technical scope of this disclosure. Elements common to the drawings are denoted by the same reference signs. Elements in the drawings may not be consistent with the actual size or proportion.

The hatching in the drawings for distinguishing individual elements and does not always represent a cross-section. The embodiments describe examples that use transistors (also abbreviated as Tr) as switching elements. Since transistors include TFTs, the transistors appearing in the embodiments can be interpreted as TFTs.

Embodiment 1

FIG. 1 is a block diagram illustrating a configuration example of an image sensor in this embodiment. The image sensor 10 includes a pixel matrix 200, a scanning circuit 400, and a detector circuit 300. In the pixel matrix 200, pixels 210 provided at intersections of vertically disposed signal lines S1 to Sm and horizontally disposed gate lines G1 to Gn are disposed in a matrix. Each of the signal lines S1 to Sm is connected to a different pixel column. Each of the gate lines G1 to Gn is connected to a different pixel row.

The pixel matrix 200 and the scanning circuit 400 are integrated on a sensor substrate 100. The sensor substrate 100 is an insulative substrate (for example, a glass substrate). The signal lines S1 to Sm are connected to the detector circuit 300 and the gate lines G1 to Gn are connected to the scanning circuit 400. Furthermore, bias lines Bias common to all pixels 210 are connected to the pixels 210.

Figure 2:
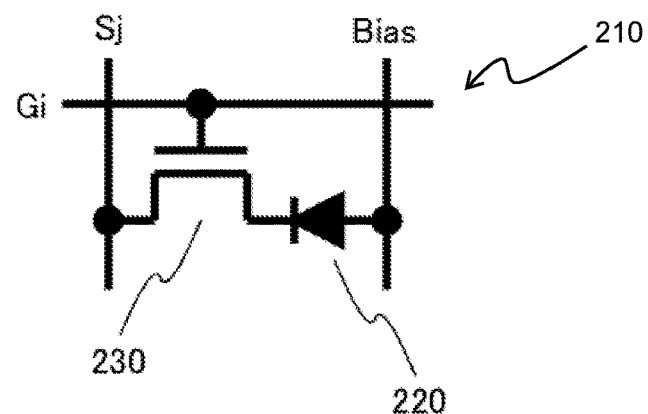
FIG. 2 is a circuit diagram illustrating an example of the circuit configuration of a pixel that is applicable to the image sensor according to Embodiment 1.

FIG. 2 is a circuit diagram illustrating an example of the circuit configuration of a pixel 210 that is applicable to the image sensor 10 in this embodiment. The pixel 210 in FIG. 2 is the pixel 210 in the i-th row from the top and the j-th column from the left in FIG. 1. The pixel 210 includes a photoelectric conversion element 220 and a transistor 230 as a switching element. An example of the photoelectric conversion element 220 is a photodiode. The following description is provided assuming that the photoelectric conversion element 220 is a photodiode.

The gate terminal of the transistor 230 is connected to the gate line Gi; the drain terminal is connected to the signal line Sj; and the source terminal is connected to the cathode terminal of the photodiode of the photoelectric conversion element 220. In the example of FIG. 2, the anode terminal of the photodiode of the photoelectric conversion element 220 is connected to a bias line Bias.

Figure 3:
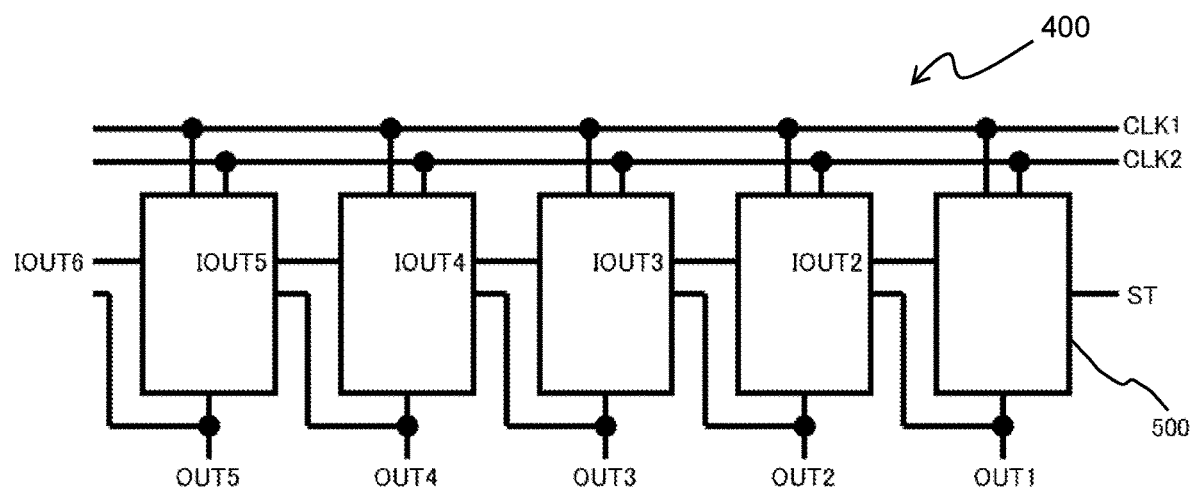
FIG. 3 is a block diagram illustrating a configuration example of a scanning circuit that is applicable to the image sensor according to Embodiment 1.

FIG. 3 is a block diagram illustrating a configuration example of the scanning circuit 400 that is applicable to the image sensor 10 in this embodiment. The scanning circuit 400 includes a plurality of transfer units (hereinafter, referred to as blocks 500) disposed in a line. Each block 500 is connected to the next block 500. Each block 500 outputs at least one output signal (OUTi, where i is an integer not less than one and not more than n). The output signal OUTi is output to the output terminal connected to the gate line Gi.

The blocks 500 are supplied with a plurality of clock signals (in the example of FIG. 3, CLK1 and CLK2). The blocks 500 are connected by lines for sending and receiving an output signal OUTi and an internal output signal IOUTi between adjacent blocks 500. The block 500 at one end of the scanning circuit 400 receives a start signal ST from the external.

Depending on the function of the scanning circuit 400, additional control signals may be input. Although FIG. 3 includes five selected blocks 500, the number of blocks in the scanning circuit 400 is larger than the number of gate lines in the image sensor 10.

Figure 4:
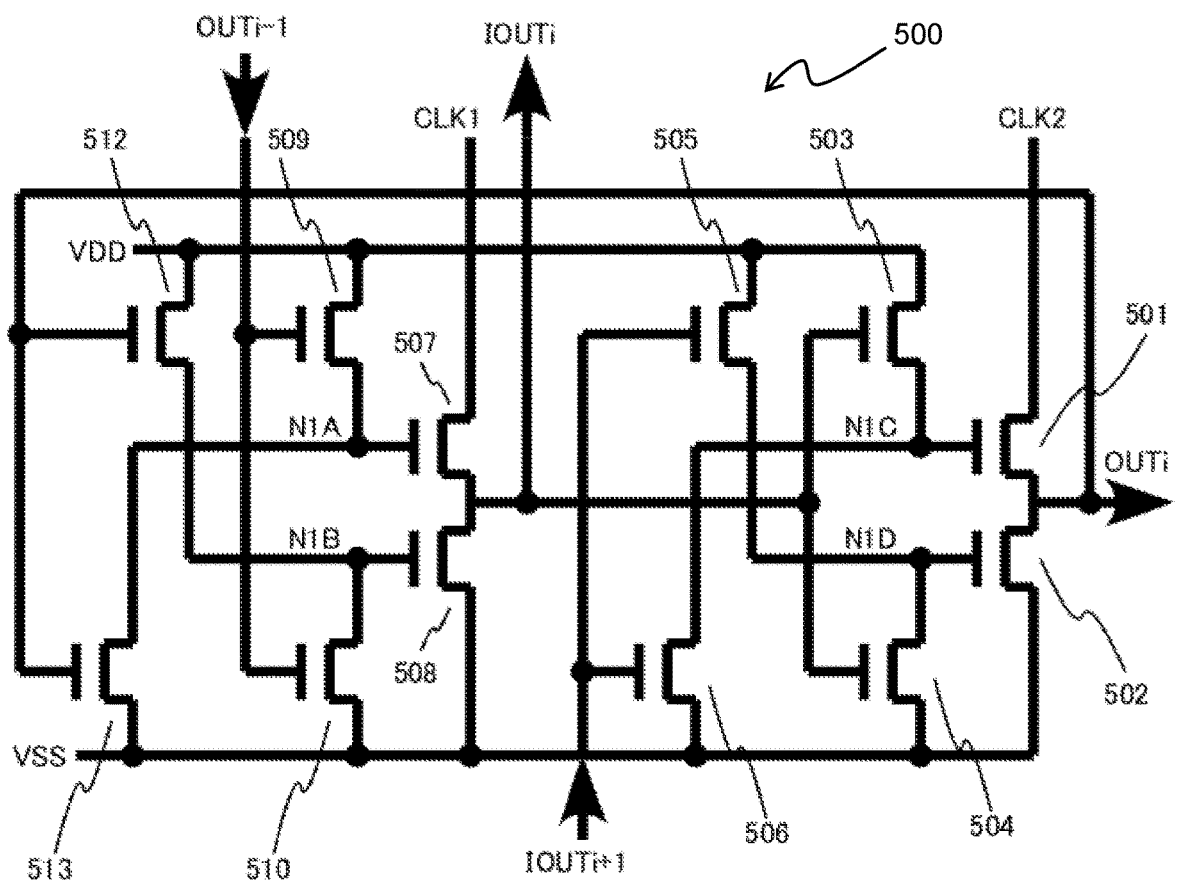
FIG. 4 is a circuit diagram illustrating an example of the circuit configuration of a block according to Embodiment 1.

FIG. 4 is a circuit diagram illustrating an example of the circuit configuration of a block (the i-th block) 500 in the scanning circuit 400 in FIG. 3 that is applicable to the image sensor 10. In the blocks 500 at the ends of the scanning circuit 400, the block 500 to receive the start signal ST is referred to as initial block and the block 500 at the other end is referred to as final block.

The i-th block counted from the initial block in the scanning circuit 400 is referred to as i-th block. In the blocks 500 adjacent to a given block 500, the block closer to the initial block is referred to as previous block of the given block 500 and the block closer to the final block is referred to as next block of the given block 500. FIG. 4 illustrates an example of the circuit configuration of the i-th block.

The scanning circuit 400 in FIG. 3 is controlled in accordance with two clock signals CLK1 and CLK2, the output signal OUTi−1 from the previous block, and the internal output signal IOUTi+1 from the next block. The VDD and VSS in FIG. 4 represent a high potential voltage source and a low potential voltage source, respectively.

For the initial block, a start signal is input, instead of the output signal of the previous block. The reason why the number of blocks 500 is larger than the number of gate lines in the image sensor is that each block 500 uses the internal output of the next block to control the block 500. If the internal output to be input to the final block is supplied from the external, the number of blocks 500 in the scanning circuit 400 can be equal to the number of gate lines in the image sensor.

Figure 5:
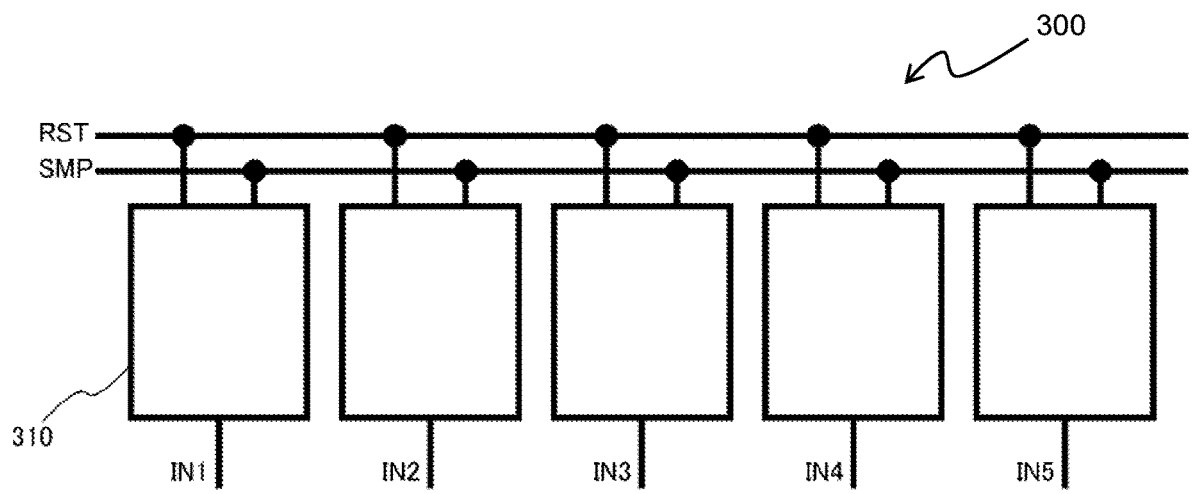
FIG. 5 is a block diagram illustrating a configuration example of a detector circuit according to Embodiment 1.

FIG. 5 is a block diagram illustrating a configuration example of the detector circuit 300 that is applicable to the image sensor 10 in this embodiment. The detector circuit 300 includes detector circuit blocks 310 disposed in a line. The number of detector circuit blocks 300 is equal to or larger than the number of signal lines in the image sensor 10. Each detector circuit block 310 has an input terminal (one of IN1 to IN5) connected to a signal line of the image sensor 10 and is controlled in accordance with control signals RST and SMP.

Figure 6:
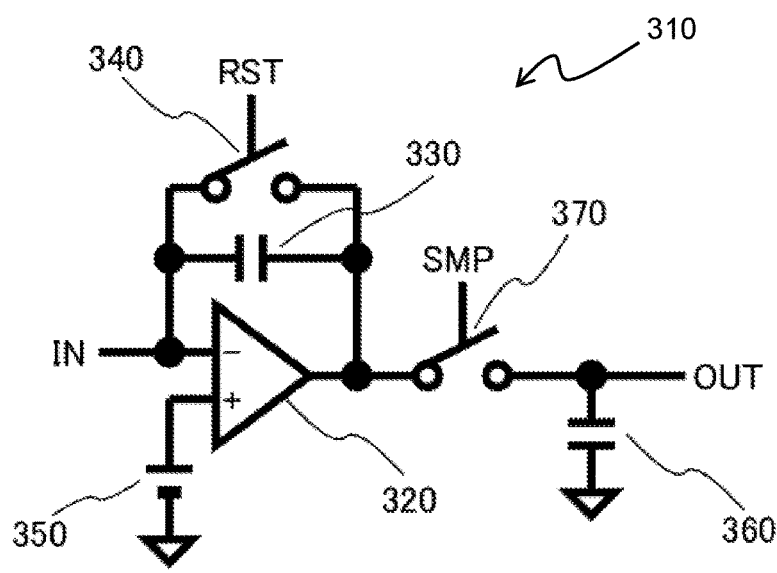
FIG. 6 is a circuit diagram illustrating an example of a circuit configuration of a detector circuit block according to Embodiment 1.

FIG. 6 is a circuit diagram illustrating an example of the circuit configuration of a detector circuit block 310. The detector circuit block 310 includes an operational amplifier circuit 320, a feedback capacitor 330, a reset switch 340, a reference voltage supply 350, a sampling capacitor 360, and a sampling switch 370, for example.

The detector circuit block 310 includes two function blocks. One function block is an integrating circuit including the operational amplifier circuit 320, the feedback capacitor 330, the reset switch 340, and the reference voltage supply 350. The other function block is a sampling circuit including the sampling capacitor 360 and the sampling switch 370. The reset switch 340 in the integrating circuit is controlled to be opened or closed in accordance with the control signal RST. The sampling switch 370 in the sampling circuit is controlled to be opened or closed in accordance with the control signal SMP.

Figure 7:
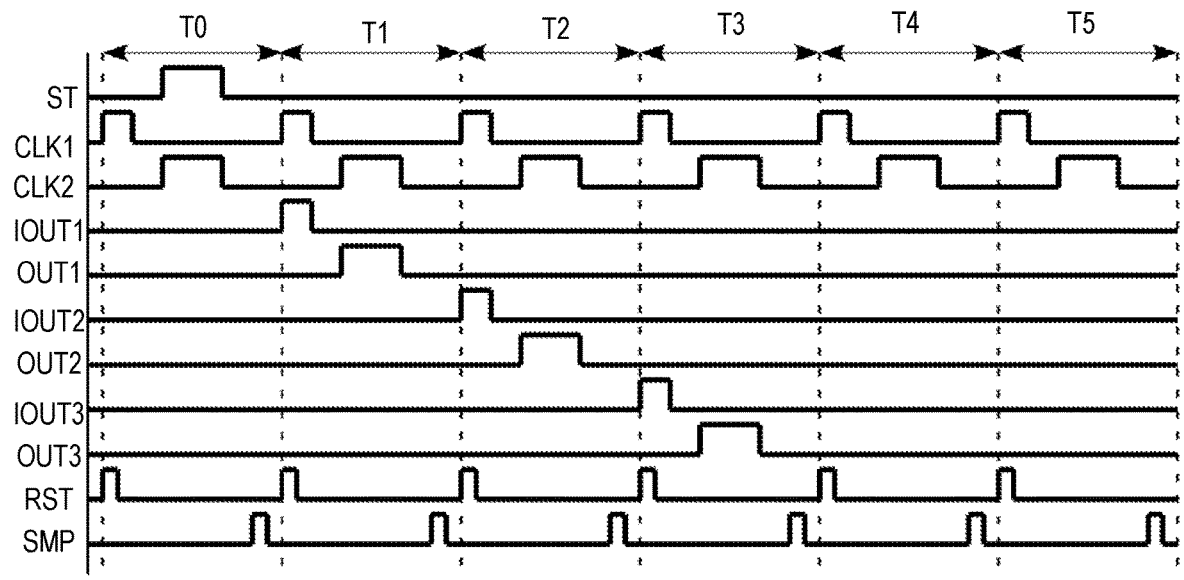
FIG. 7 is a timing chart illustrating an operation example of the scanning circuit according to Embodiment 1.

FIG. 7 is a timing chart illustrating an operation example of the scanning circuit 400 in this embodiment. Described herein is an operation example in the case where the transistors included in the scanning circuit 400 have a conductivity of n-type and their threshold voltages are positive. An operation example of the scanning circuit 400 is described first and thereafter, an operation example of the overall image sensor 10 is described.

First, the operation example of the scanning circuit 400 is described. Each of the periods T0 to T5 in the timing chart is a period (hereinafter, also referred to as horizontal period) in which the image sensor 10 outputs a signal of one pixel row connected to one gate line. In each horizontal period, the clock signals CLK1 and CLK2 are given a pulse at different times.

The clock signals can be rectangular waves having a cycle of one horizontal period. It is preferable that the plurality of clock signals not be high at the same time. Furthermore, it is preferable that each clock signal have the same rise time of a pulse, the same pulse width, and the same pulse height among each of the horizontal periods.

In the period T0, the scanning circuit 400 receives a pulse of the start signal ST and a pulse of the clock signal CLK2 synchronized with each other. The potentials of all control signals, inclusive of the start signal ST, are not lower than VSS and not higher than VDD. The output signal OUTi−1 in FIG. 4 for the initial block corresponds to the start signal ST. The operation of the initial block in response to these pulses is described. The transistors 509 and 510 become conductive. The node N1A is charged to a high potential (a potential close to VDD) and the node N1B is charged to the same potential as VSS; those potentials of the nodes are maintained after the start signal ST becomes low. As a result, the transistor 507 becomes conductive and the transistor 508 becomes non-conductive.

Subsequently, when the clock signal CLK 1 becomes high, the potential of the internal output signal IOUTi increases because the transistor 507 is conductive. Furthermore, the potential of the node N1A increases because of the parasitic capacitance between the source and the gate of the transistor 507. As a result, the potential of the internal output signal IOUTi increases to the potential of VDD that is equal to the potential of the clock signal CLK1 at high level. Accordingly, a pulse like the pulse of the clock signal CLK1 is output to the internal output signal IOUTi with a slight delay.

Since the internal output signal IOUTi is connected to the gates of the transistors 503 and 504, these transistors 503 and 504 become conductive in the period while the internal output signal IOUTi is high. Then, the node N1C is charged to a high potential (a potential close to VDD); the node N1D is charged to the potential of VSS; and those potentials of the nodes are maintained after the internal output signal IOUTi becomes low. As a result, the transistor 501 becomes conductive and the transistor 502 becomes non-conductive.

Subsequently, when the clock signal CLK2 becomes high in the period T1, the potential of the output signal OUTi increases because the transistor 501 is conductive. Furthermore, the potential of the node N1C increases because of the parasitic capacitance between the source and the gate of the transistor 501. As a result, the potential of the output signal OUTi increases to the potential of VDD that is equal to the potential of the clock signal CLK2 at high level. Accordingly, a pulse like the pulse of the clock signal CLK2 is output to the output signal OUTi with a slight delay.

Since the output signal OUTi is connected to the gates of the transistors 512 and 513, these two transistors become conductive in the period while the output signal OUTi is high. Then, the node N1A is charged to the potential of VSS; the node N1B is charged to a high potential (a potential close to VDD); and those potentials are maintained at the nodes. As a result, the transistor 507 becomes non-conductive; the transistor 508 becomes conductive; and the potential of the internal output signal IOUTi becomes equal to the potential of VSS.

Through the same operation of the second block as the operation of the initial block, a pulse like the pulse of the clock signal CLK1 in the period T2 is output to the internal output signal IOUTi+1 of the second block with a slight delay. Then in the initial block, the transistors 505 and 506 become conductive; the node N1C is charged to the potential of VSS; the node N1D is charged to a high potential (a potential close to VDD); and those potentials are maintained at the nodes. As a result, the transistor 501 becomes non-conductive; the transistor 502 becomes conductive; and the output signal OUTi is supplied with the VSS potential.

As the foregoing operation is performed serially in all blocks, pulses synchronized with the clock signal CLK2 are serially output to n gate lines in the image sensor 10. Since the transistors connected in series between the voltage sources VDD and VSS do not become conductive together, the scanning circuit 400 achieves low power consumption and low noise caused by current.

The scanning circuit 400 applicable to the image sensor 10 in this embodiment uses two clock signals. Accordingly, the external circuit for generating the clocks can be simplified. However, the scanning circuit 400 has places (the nodes N1A, N1B, N1C, and N1D) required to hold voltage in a frame period. For this reason, it is preferable that the transistors in the scanning circuit 400 be TFTs of an oxide semiconductor represented by IGZO. The oxide semiconductor TFTs achieve small leak current, which leads to high operational stability.

The term "frame period" means a period required for the image sensor 10 to output signals of all pixels. In the case of an image sensor 10 having n pixel rows, a frame period is equal to or longer than n horizontal periods (in the later-described Embodiment 3 and Embodiment 4, equal to or longer than n+1 horizontal periods).

The foregoing description includes an expression of a high potential (a potential close to VDD). Specifically, this potential is a potential obtained by subtracting the threshold voltage of the transistor from the potential of VDD. Such a potential is generated because a transistor having a positive threshold voltage cannot make the potential of the source equal to the potential of the drain unless the gate receives a potential equal to or higher than the potential increased from the potential of the drain by the threshold voltage of the transistor.

Next, an operation example of the overall image sensor 10 in this embodiment is described. When pulses are serially output to the gate lines of the image sensor 10, the following operation is performed in the image sensor.

In the period of T1, a high-level pulse is output to the control signal RST. In response, the feedback capacitor 330 in the detector circuit 300 is discharged to reset the integrating circuit. Subsequently, a pulse synchronized with the clock signal CLK2 is output to the gate line G1. Then, the transistors of the pixels connected to the gate line G1 become conductive.

The anode terminal of each photodiode of photoelectric conversion element 220 is connected to a bias line, and the signal line connected to the photodiode is supplied with a reference voltage by the operational amplifier circuit in the integrating circuit. Therefore, the photodiode is charged to the difference voltage between the voltage of the bias line and the reference voltage. This difference voltage is set as the reverse-biases, which make the cathode potential of the photodiode be higher than the anode potential. The charges required to recharge the photodiode up to this reverse bias voltage depend on the amount of light applied to the photodiode; the optical signal can be converted to a voltage by integrating the charges with the integrating circuit in the detector circuit block.

Subsequently, a high-level pulse is output to the control signal SMP; the output voltage of the integrating circuit is held by the sampling capacitor 360. The output voltage of the integrating circuit held in the sampling circuit when the control signal SMP becomes low is a signal voltage corresponding to the amount of light applied to the photodiode. As the foregoing operation is serially performed to all gate lines, the amounts of light applied to all photodiodes in the image sensor 10 are read after being converted to voltages.

The features of the image sensor 10 in this embodiment are summarized as follows. Among the control signals for the scanning circuit 400, control signals having a cycle shorter than a frame period are only clock signals CLK1 and CLK2 and their cycles are one horizontal period.

The scanning circuit 400 in this embodiment can be formed on the sensor substrate 100 together with the pixels; the image sensor 10 can be manufactured inexpensively. Furthermore, the noise originated from the scanning circuit 400 is significantly low, although the transistors included in the scanning circuit 400 have the same conductivity type. The low noise leads to reduction in FPN, increase in S/N ratio, and increase in dynamic range. The reasons for these advantages are described in the following.

First, the reason why the image sensor 10 in this embodiment can be manufactured inexpensively is described. As mentioned above, the scanning circuit 400 can be formed on the sensor substrate 100 together with the pixels and therefore, the cost of the IC for the scanning circuit and the cost to mount the IC are unnecessary.

Next, the reason for the low noise is described. In the image sensor 10 in this embodiment, as shown in the timing chart of FIG. 7, all control signals except for the start signal, inclusive of the clock signals CLK1 and CLK2, vary in voltage within every horizontal period.

In the conventional image sensor, however, not all control signals except for the start signal vary in voltage in every horizontal period. Specifically, in an image sensor controlled with two clock signals, one clock signal (referred to as C-CLK1) varies in voltage only in the odd-numbered horizontal periods such as the horizontal periods T1 and T3 and the other clock signal (referred to as C-CLK2) varies in voltage only in the even-numbered horizontal periods such as the horizontal periods T2 and T4. This means that the noise mixed in the odd-numbered horizontal period differs from the noise mixed in the even-numbered horizontal period.

In general, an image sensor reads the signal charge held in the photodiode of each pixel by making the transistor in the pixel conductive, recharging the photodiode to be reverse-biased, and reading the charge through the signal line. The signal charge held by the photodiode is extremely small. If electromagnetic noise is applied to the signal line when the charges flow in the signal line and are integrated by the integrating circuit, the electromagnetic noise is added to the signal. The electromagnetic noise includes not only the noise depending on the operation environment but also potential variation of the control signals for controlling the scanning circuit and the detector circuit in the image sensor.

In the aforementioned conventional image sensor, the clock signal C-CLK1 varies but the clock signal C-CLK2 does not vary in potential in the odd-numbered horizontal periods. As a result, in the odd-numbered horizontal periods, electromagnetic noise caused by potential variation in the clock signal C-CLK1 is added to the signal but no electromagnetic noise is generated because of no potential variation in the clock signal C-CLK2.

In similar, in the even-numbered horizontal periods, the clock signal C-CLK1 does not vary and only the clock signal C-CLK2 varies in potential. As a result, in the even-numbered horizontal periods, electromagnetic noise caused by potential variation in the clock signal C-CLK2 is added to the signal but no electromagnetic noise is generated because of no potential variation in the clock signal C-CLK1.

That is to say, the electromagnetic noise added to the signal to be read is different between the odd-numbered horizontal periods and the even-numbered horizontal periods. In general, the signal charge in an image sensor are approximately 1 pC at most and the desired resolution is in order of femtocoulombs. Accordingly, even if the pulse amplitudes of the different clock signals are adjusted as precisely as possible, it is impossible to completely equalize the electromagnetic noise to be added to the signal charge.

As a result, even if the image sensor is irradiated with uniform light, the signal voltages detected from the odd-numbered pixel rows and the even numbered pixel rows are different. When those signals are rendered in gray levels, unevenness like a horizontal stripe is generated between an odd-numbered pixel row and an even-numbered pixel row.

In the image sensor 10 in this embodiment, however, all control signals except for the start signal vary in potential in every horizontal period and the variations in potential are equal. Accordingly, in all horizontal periods except for the horizontal period in which the start signal becomes high, electromagnetic noise of all control signals is equally added to the signals. As a result, the aforementioned horizontally-striped unevenness is not generated in the image sensor 10 in this embodiment. This noise is more distinct when the image sensor 10 is larger and has a larger number of pixels. Accordingly, the technique of this embodiment exerts remarkable effects onto a large-sized high-resolution image sensor. Furthermore, the technique of this embodiment brings the above-described effects in taking a still image or motion picture in not only visible light but also X-rays, for example.

The above-described horizontally-striped unevenness generated in the conventional image sensors are the noise categorized as fixed pattern noise that does not vary with time and therefore, it is possible to add a noise removal function to the detector circuit or remove the noise in the software processing after the signal is digitalized. However, taking such a measure yields another problem such as increase in cost of the detector circuit, reduction in dynamic range, or increase in software processing time.

Applying the image sensor 10 in this embodiment to an X-ray imaging device enables the X-ray imaging device to be manufactured inexpensively without taking such a measure. In addition, the minimal control signals from the external to operate the scanning circuit 400 are the start signal and the two clock signals. In other words, the scanning circuit 400 in this embodiment can be operated with a small number of control signals and therefore, the number of noise sources is small. The image sensor 10 in this embodiment is applicable to taking a still image or motion picture of transmitted X-rays.

Embodiment 2

Figure 8:
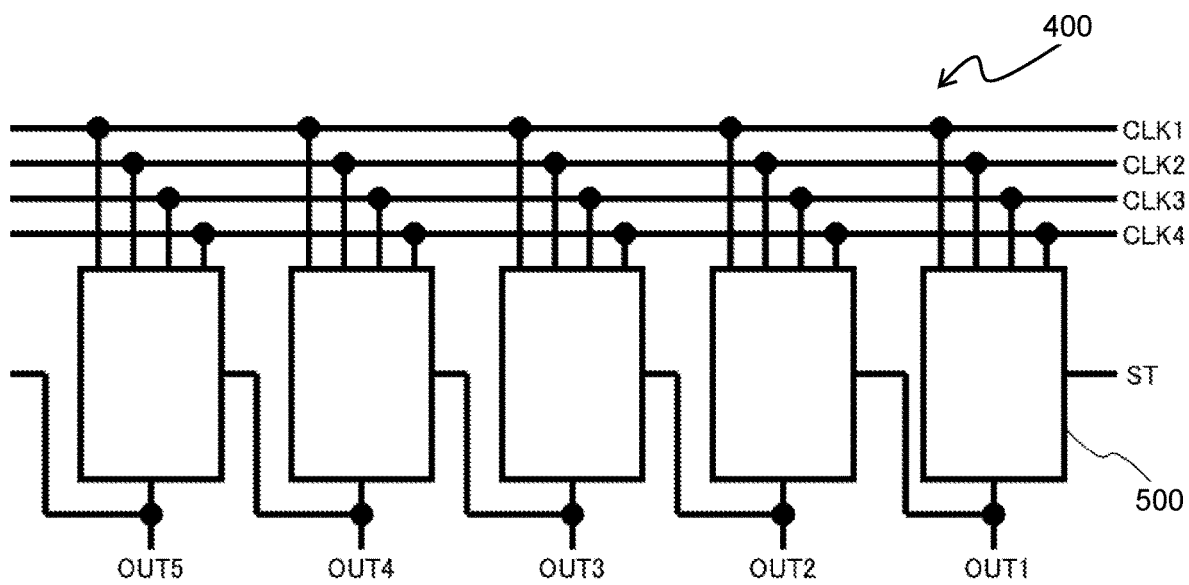
FIG. 8 is a block diagram illustrating a configuration example of the scanning circuit according to Embodiment 2.
Figure 9:
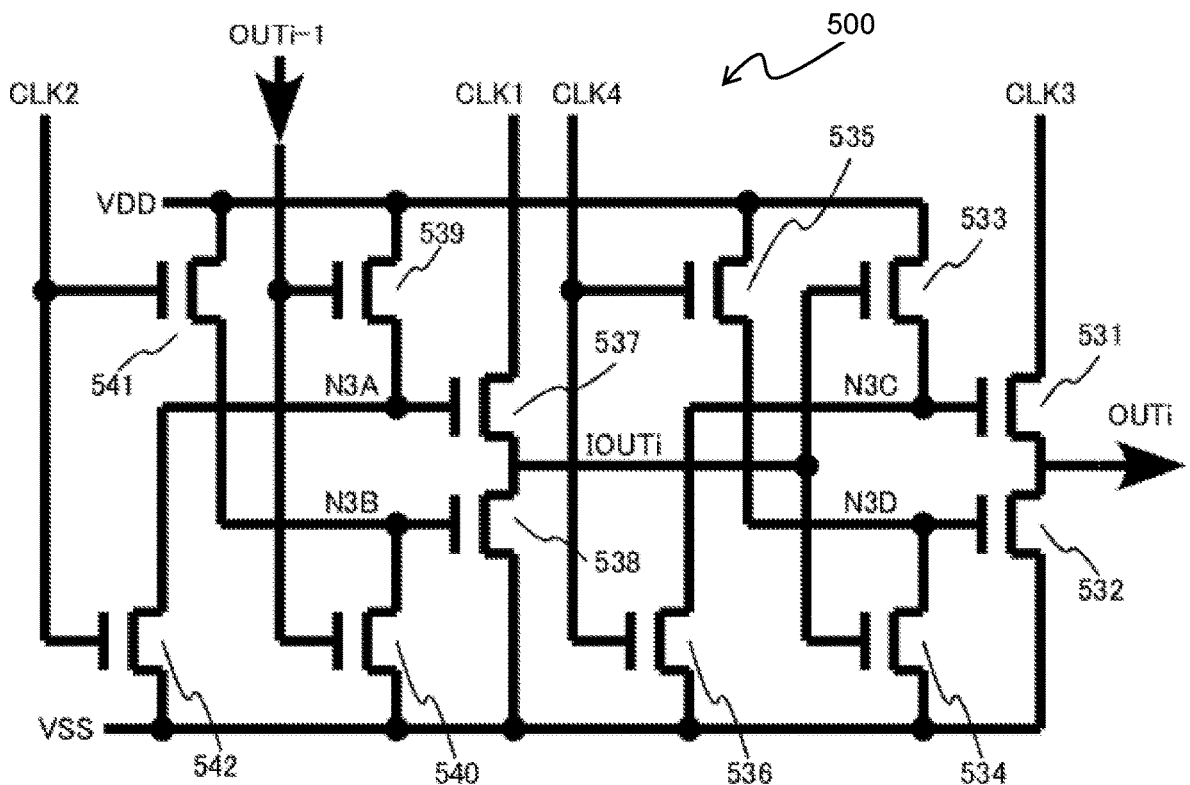
FIG. 9 is a circuit diagram illustrating an example of the circuit configuration of a block in the scanning circuit according to Embodiment 2.

The image sensor 10 in this embodiment is different from the image sensor 10 in Embodiment 1 in that the scanning circuit 400. Differences from Embodiment 1 are described. FIG. 8 is a block diagram illustrating a configuration example of the scanning circuit 400 in this embodiment. The scanning circuit 400 in this embodiment is different from the scanning circuit 400 in Embodiment 1 in the points that the number of clock signals is four (CLK1 to CLK4) and each block does not receive the internal output signal IOUTi+1 from the next block. FIG. 9 is a circuit diagram illustrating an example of the circuit configuration of a block (the i-th block) 500 in the scanning circuit 400 in this embodiment. The circuit of each block 500 includes twelve transistors, for example.

Figure 10:
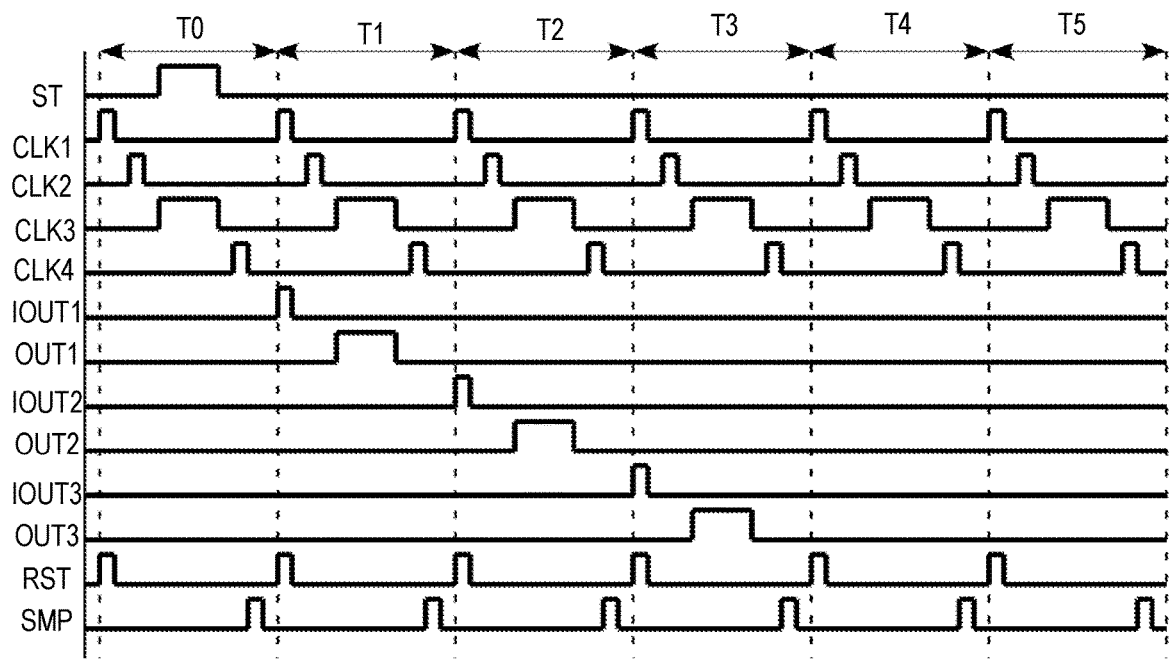
FIG. 10 is a timing chart illustrating an operation example of the scanning circuit according to Embodiment 2.

FIG. 10 is a timing chart illustrating an operation example of the scanning circuit 400 in this embodiment. In each horizontal period, pulses are output to the four clock signals CLK1 to CLK4 at different times. In the horizontal period T0, a pulse is output to the start signal ST synchronously with a pulse of the clock signal CLK3.

Then, the transistors 539 and 540 in the initial block become conductive; the node N3A is charged to a high potential (a potential close to VDD); the node N3B is charged to the potential of VSS; and the potentials are maintained after the start signal ST becomes low. Accordingly, the transistor 537 becomes conductive and the transistor 538 becomes non-conductive.

Subsequently in the horizontal period T1, when the clock signal CLK1 becomes high, the potential of the internal output signal IOUTi increases because the transistor 537 is conductive. Furthermore, the potential of the node N3A increases because of the parasitic capacitance between the source and the gate of the transistor 537, so that the potential of the internal output signal IOUTi increases to the potential of VDD.

When the clock signal CLK1 becomes low, the potential of the internal output signal IOUTi decreases to VSS. That is to say, a pulse like the pulse of the clock signal CLK1 is output to the internal output signal IOUTi with a slight delay. Since the internal output signal IOUTi is connected to the gates of the transistors 533 and 534, the node N3C is charged to a high potential (a potential close to VDD) and the node N3D is charged to the potential of VSS when the internal output signal IOUTi is high, and those potentials are maintained after the potential of the internal output signal IOUTi becomes low.

After a pulse is output to the clock signal CLK1, a pulse is output to the clock signal CLK2. Then, the transistors 541 and 542 become conductive; the node N3A is charged to the potential of VSS; the node N3B is charged to a high potential (a potential close to VDD); and those potentials are maintained after the clock signal CLK2 becomes low.

When a pulse is output to the clock signal CLK3, the potential of the output signal OUTi increases because the transistor 531 is conductive. Furthermore, the potential of the node N3C increases because of the parasitic capacitance between the source and the gate of the transistor 531, so that the potential of the output signal OUTi increases to the potential of VDD. When the clock signal CLK3 becomes low, the potential of the output signal OUTi decreases to VSS. That is to say, a pulse like the pulse of the clock signal CLK3 is output to the output signal OUTi with a slight delay.

Subsequently, a pulse is output to the clock signal CLK4. Then, the transistors 535 and 536 become conductive; the node N3C is charged to the potential of VSS; the node N3D is charged to a high potential (a potential close to the VDD); and the potentials are maintained after the clock signal CLK4 become low. As a result, the transistor 531 becomes non-conductive and the transistor 532 becomes conductive and accordingly, the VSS potential is supplied to the output signal OUTi. As the foregoing operation is serially performed in all blocks 500, pulses synchronized with the clock signal CLK3 are serially output to the output signals OUTi of the blocks 500 in the scanning circuit 400.

The image sensor 10 in this embodiment has an advantage such that stable operation is maintained even if the source-drain leak current of the transistors in the scanning circuit 400 has increased to some level, in addition to the advantages described in Embodiment 1. Hereinafter, the reason for this advantage is described.

In each block 500 of the scanning circuit 400 of the image sensor 10 in this embodiment, the nodes N3A, N3B, N3C, and N3D are charged in every horizontal period. In contrast, the nodes N1A, N1B, N1C, and N1D in the scanning circuit 400 in Embodiment 1 respectively corresponding to the nodes N3A, N3B, N3C, and N3D in Embodiment 2 are charged only once in a frame period.

In general, an X-ray image sensor has 1000 or more of gate lines; a frame period of the X-ray image sensor is 1000 times or more of a horizontal period. For this reason, even if the leak current of each transistor is very small, the potentials of the above-mentioned nodes could be lowered within a frame period to fail in maintaining the states (conductive state or non-conductive state) of the transistors whose gates are connected to these nodes.

The nodes N3A, N3B, N3C, and N3D in the image sensor 10 in this embodiment are recharged in a short cycle of a horizontal period; the potentials of these nodes do not change very much even if the leak current of the transistors has increased to some level. Accordingly, increase in clock signals in the image sensor 10 in this embodiment contributes to stable operation even in the case where the image sensor 10 in this embodiment is employed as an X-ray image sensor.

The above description applies to an image sensor 10 including a-Si TFTs available at low manufacturing cost, instead of oxide semiconductor TFTs represented by IGZO TFTs. Accordingly, an inexpensive image sensor 10 having the above-described advantages is attained by using a-Si TFTs. Furthermore, regardless of the material of the semiconductor layer of the transistor, the scanning circuit has a large operation margin; accordingly, a high yield rate can be expected. As a result, the cost of the image sensor 10 can be lowered.

Embodiment 3

Figure 11:
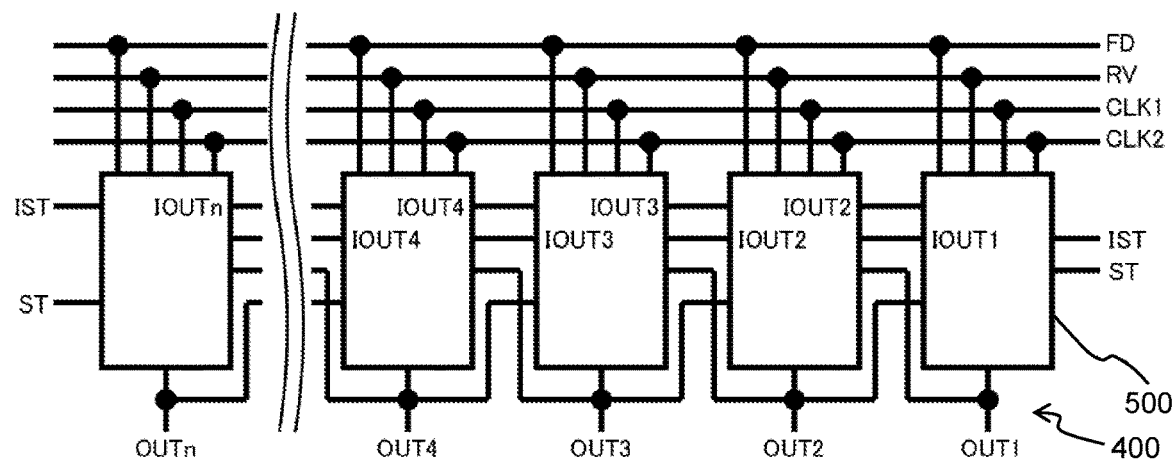
FIG. 11 is a block diagram illustrating a configuration example of the scanning circuit according to Embodiment 3.

The image sensor 10 in this embodiment is different from the image sensor 10 in Embodiment 1 in that the scanning circuit 400. Hereinafter, differences from Embodiment 1 are described. FIG. 11 is a block diagram illustrating a configuration example of the scanning circuit 400 in this embodiment.

The scanning circuit 400 in this embodiment is different from the scanning circuit 400 in Embodiment 1 in the point that the control signals include a forward signal FD and a reverse signal RV. Furthermore, the initial block is supplied with an end signal IST in addition to the start signal ST and the final block (n-th block) is also supplied with the start signal ST and the end signal IST.

Each block 500 except for the final block outputs the internal output signal IOUTi to the next block as well as the previous block. Each block 500 except for the initial block outputs the output signal OUTi to the previous block as well as the next block. The number of blocks 500 in this embodiment is equal to the number of gate lines.

Figure 12:
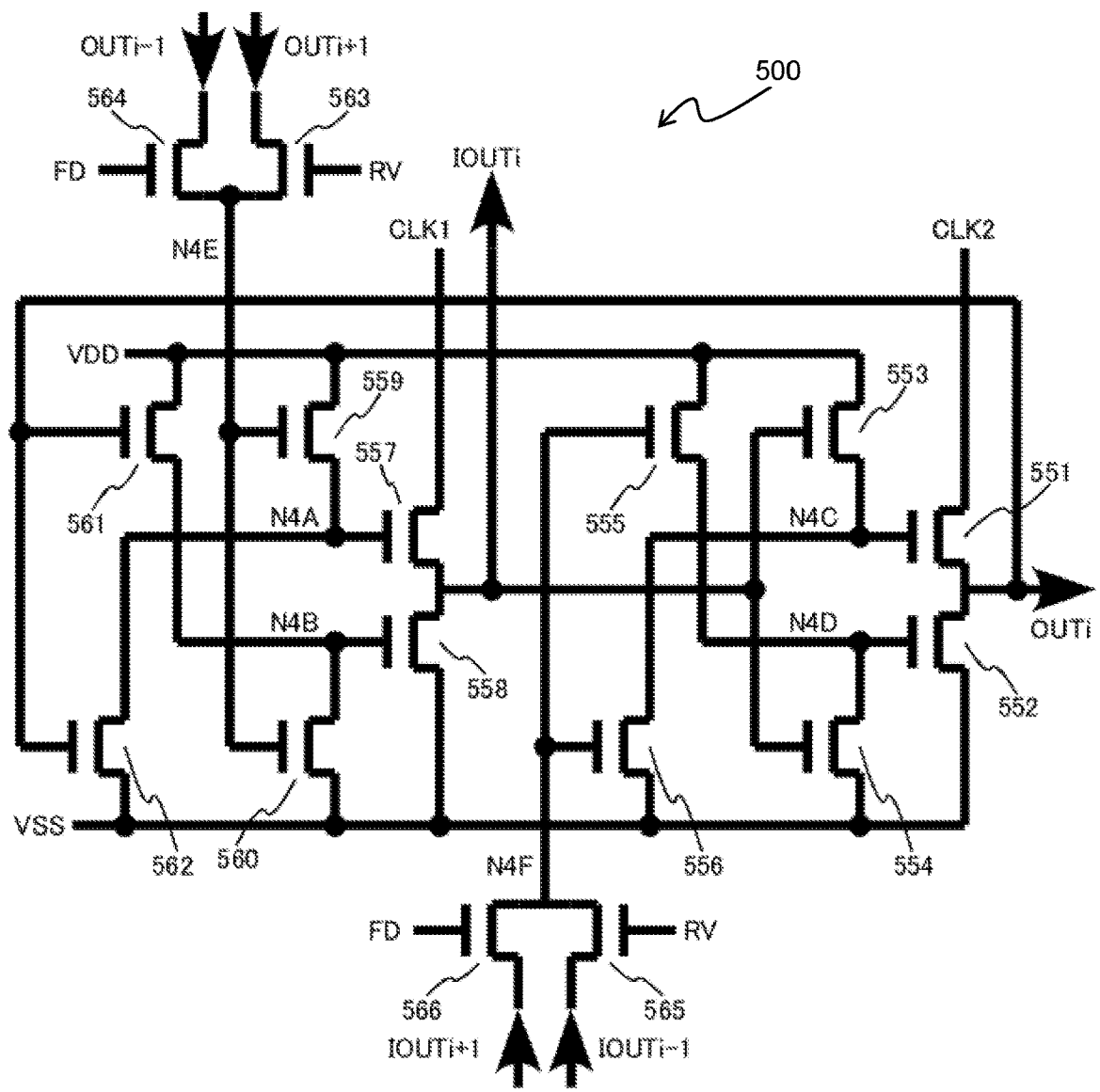
FIG. 12 is a circuit diagram illustrating an example of the circuit configuration of a block in the scanning circuit according to Embodiment 3.

FIG. 12 is a circuit diagram illustrating an example of the circuit configuration of a block (the i-th block) 500 in the scanning circuit 400 in this embodiment. The circuit of each block 500 in this embodiment includes transistors 563, 564, 565, and 566, in addition to the circuit of a block in Embodiment 1 illustrated in FIG. 4. The scanning circuit 400 in this embodiment controls the order of blocks 500 to output pulses using the forward signal FD and the reverse signal RV.

Figure 13:
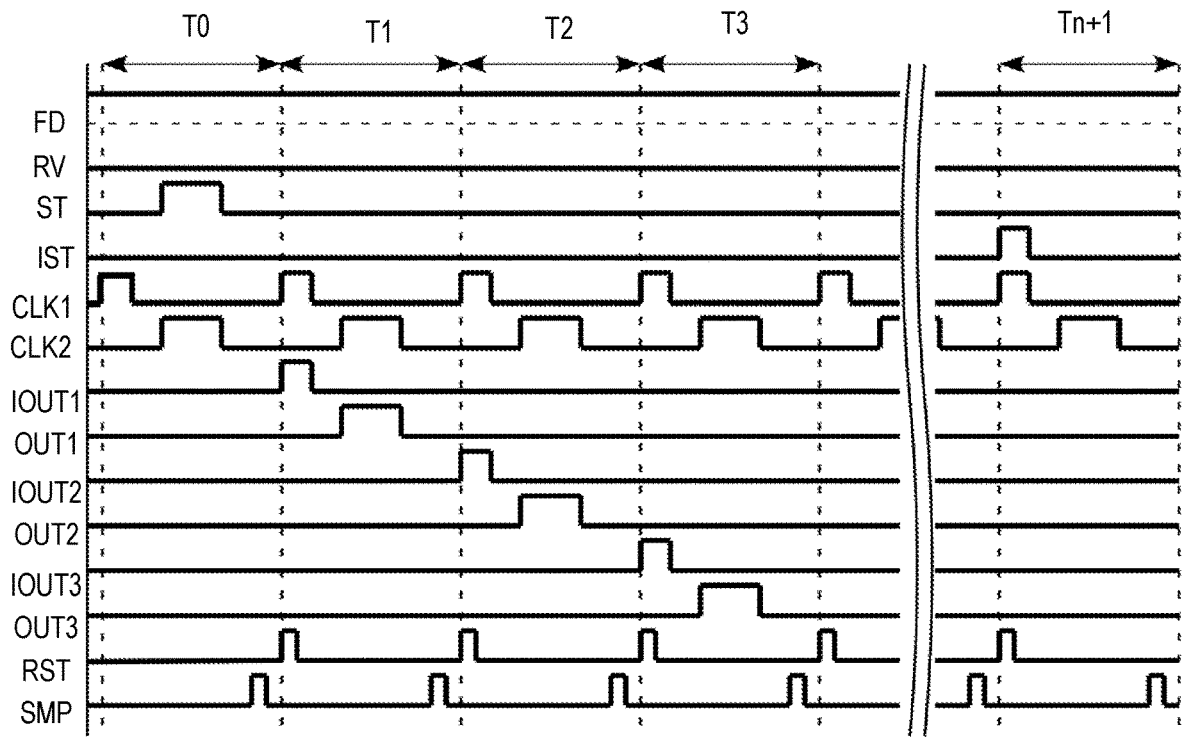
FIG. 13 is a timing chart illustrating operation examples of the scanning circuit that outputs pulses to forward direction according to Embodiment 3.
Figure 14:
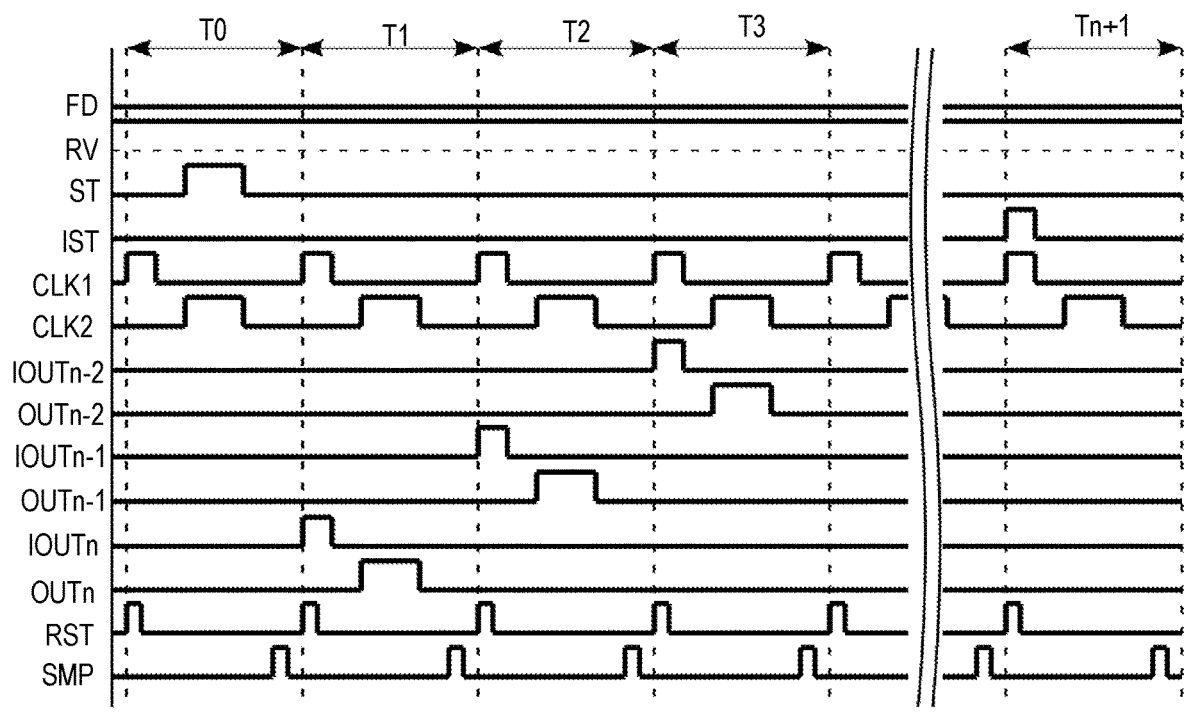
FIG. 14 is a timing chart illustrating operation examples of the scanning circuit that outputs pulses to reverse direction according to Embodiment 3.

FIGS. 13 and 14 are timing charts illustrating operation examples of the scanning circuit 400 in this embodiment. The timing chart of FIG. 13 illustrates an operation example in which pulses are output in the order of the initial block, the second block, the third block, . . . . This order is defined as forward direction.

In the forward operation, each block 500 is supplied with a signal maintaining a high potential (for example, VDD) as the forward signal FD and a signal maintaining a low potential (for example, VSS) as the reverse signal RV. Accordingly, the transistors 564 and 566 become conductive and the transistors 563 and 565 become non-conductive in each block 500.

Accordingly, the block 500 becomes a state equivalent to the state where the node N4E is connected to the output signal OUTi−1 and the node N4F is connected to the output signal OUTi+1. This state is the same as the circuit configuration provided in Embodiment 1; the other operation is the same as the operation in Embodiment 1.

On the other hand, the timing chart of FIG. 14 illustrates an operation example in which pulses are output in the order of the n-th block, the (n−1)th block, the (n−2)th block, . . . . This order is defined as reverse direction. In the reverse operation, each block 500 is supplied with a signal maintaining a low potential (for example, VSS) as the forward signal FD and a signal maintaining a high potential (for example, VDD) as the reverse signal RV.

Accordingly, the transistors 564 and 566 become non-conductive and the transistors 563 and 565 become conductive in each block 500. The block 500 becomes a state equivalent to the state where the node N4E is connected to the output signal OUTi+1 and the node N4F is connected to the output signal OUTi−1.

That is to say, in this reverse operation, the connection in the forward operation so that the output signal OUTi output from the initial block is connected and transferred to the second block and the internal output signal IOUTi output from the third block is connected and transferred to the second block is changed to the connection so that the output signal OUTi output from the final n-th block is connected and transferred to the (n−1)th block and the internal output signal IOUTi output from the (n−2)th block is connected and transferred to the (n−1)th block.

Accordingly, the circuit operation of each block 500 in the reverse operation is not different from the circuit operation in the forward operation and only the direction to transfer the signals is reversed. Hence, the pulses are output in the order of the final n-th block, the (n−1)th block, the (n−2)th block, . . . , as illustrated in the timing chart of FIG. 14.

The image sensor 10 in this embodiment provides increased usability, in addition to the advantages described in Embodiment 1. Hereinafter, the reasons for this advantage are described. For example, in mounting the image sensor 10 onto an X-ray imaging device, the orientation of the image sensor may be restricted because of the shape of the X-ray imaging device. Furthermore, the orientation (the vertical direction in FIG. 1) of the image taken by the image sensor is specified in many cases.

The orientation of the image taken by the image sensor might be opposite from the specified orientation. When such a situation occurs, the order of signal acquisition needs to be changed with software. However, the image sensor 10 in this embodiment provides increased usability such that the user can desirably change the order of acquisition of the signals output from the image sensor 10 without software.

Embodiment 4

Figure 15:
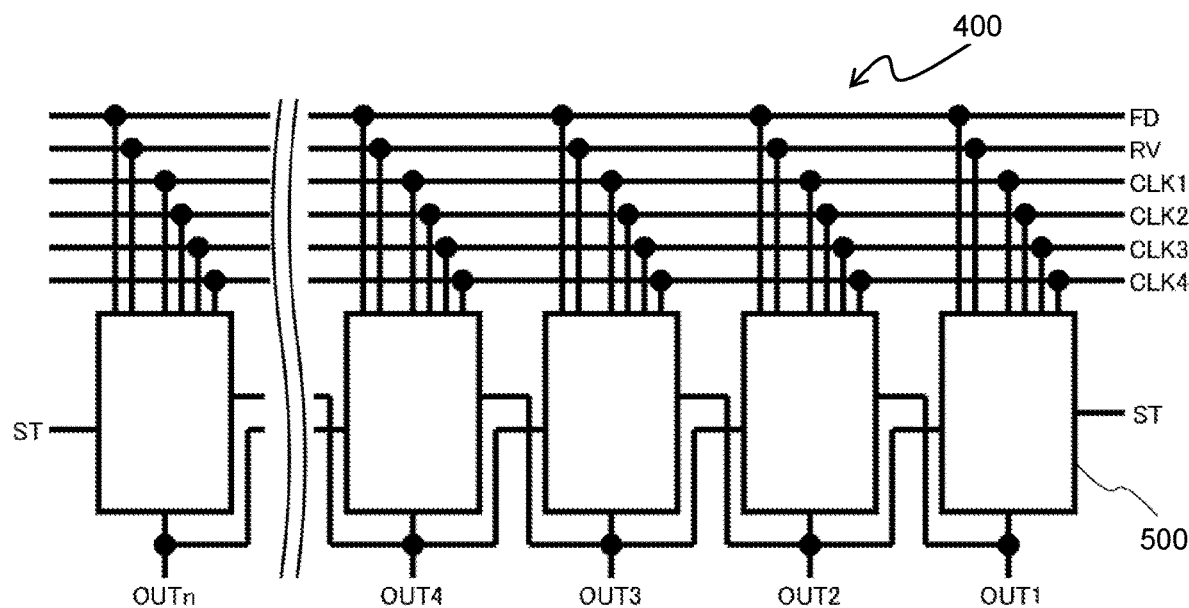
FIG. 15 is a block diagram illustrating a configuration example of the scanning circuit according to Embodiment 4.

The image sensor 10 in this embodiment is different from the image sensor 10 in Embodiment 2 in that the scanning circuit 400. Hereinafter, differences from Embodiment 2 are described. FIG. 15 is a block diagram illustrating a configuration example of the scanning circuit 400 in this embodiment. The scanning circuit 400 in this embodiment is different from the scanning circuit 400 in Embodiment 2 illustrated in FIG. 8 in the point that the control signals include a forward signal FD and a reverse signal RV. Furthermore, the final n-th block is supplied with the start signal ST, instead of the internal output signal OUTi+1.

Figure 16:
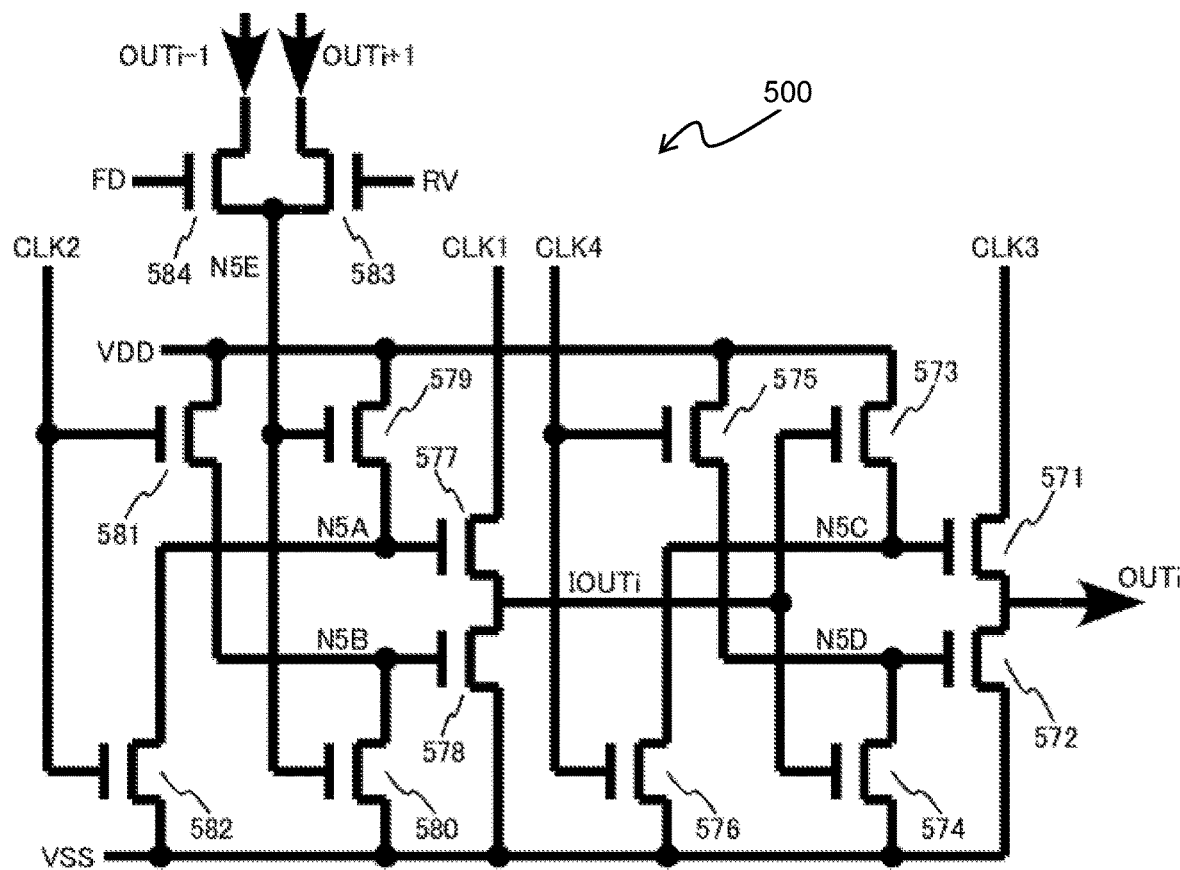
FIG. 16 is a circuit diagram illustrating an example of the circuit configuration of a block in the scanning circuit according to Embodiment 4.

FIG. 16 is a circuit diagram illustrating an example of the circuit configuration of a block (the i-th block) 500 in the scanning circuit 400 in this embodiment. The circuit in this embodiment includes transistors 583 and 584, in addition to the circuit of a block in the scanning circuit 400 in Embodiment 2 illustrated in FIG. 9.

Figure 17:
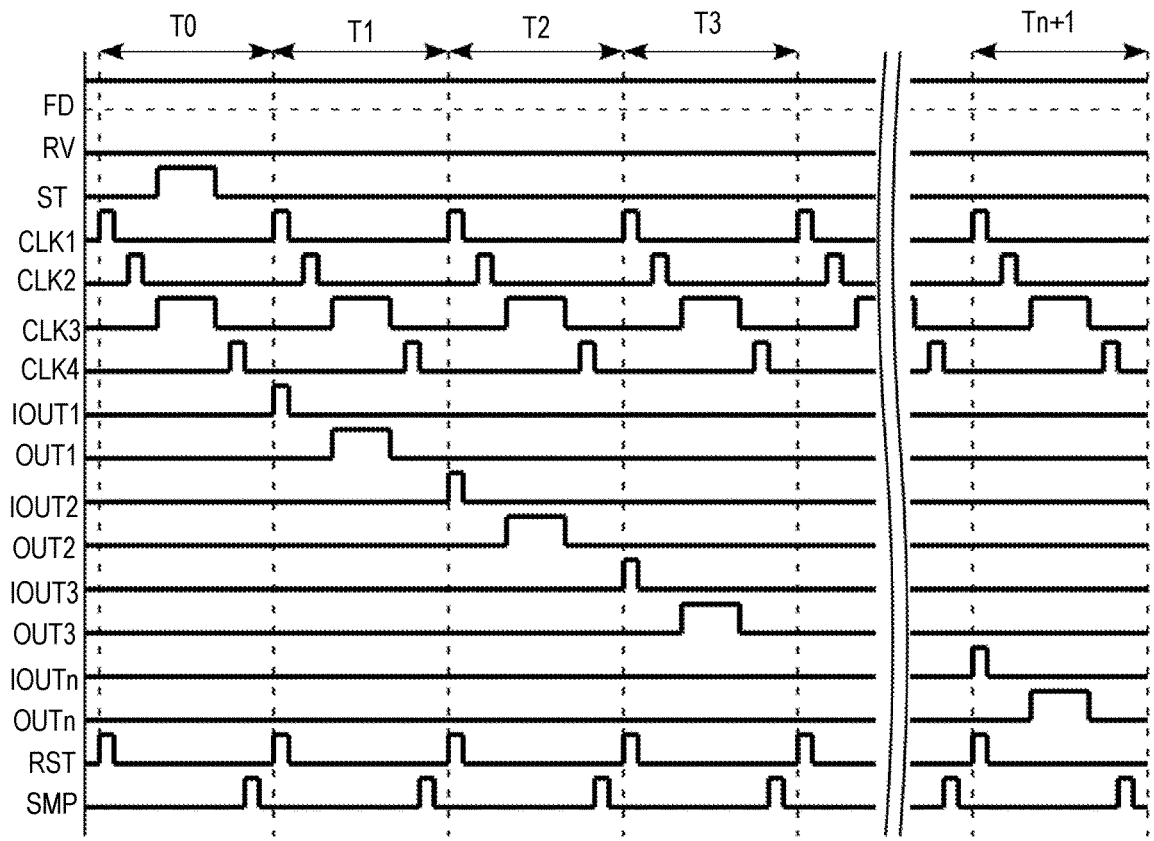
FIG. 17 is a timing chart illustrating operation examples of the scanning circuit that outputs pulses to forward direction according to Embodiment 4.
Figure 18:
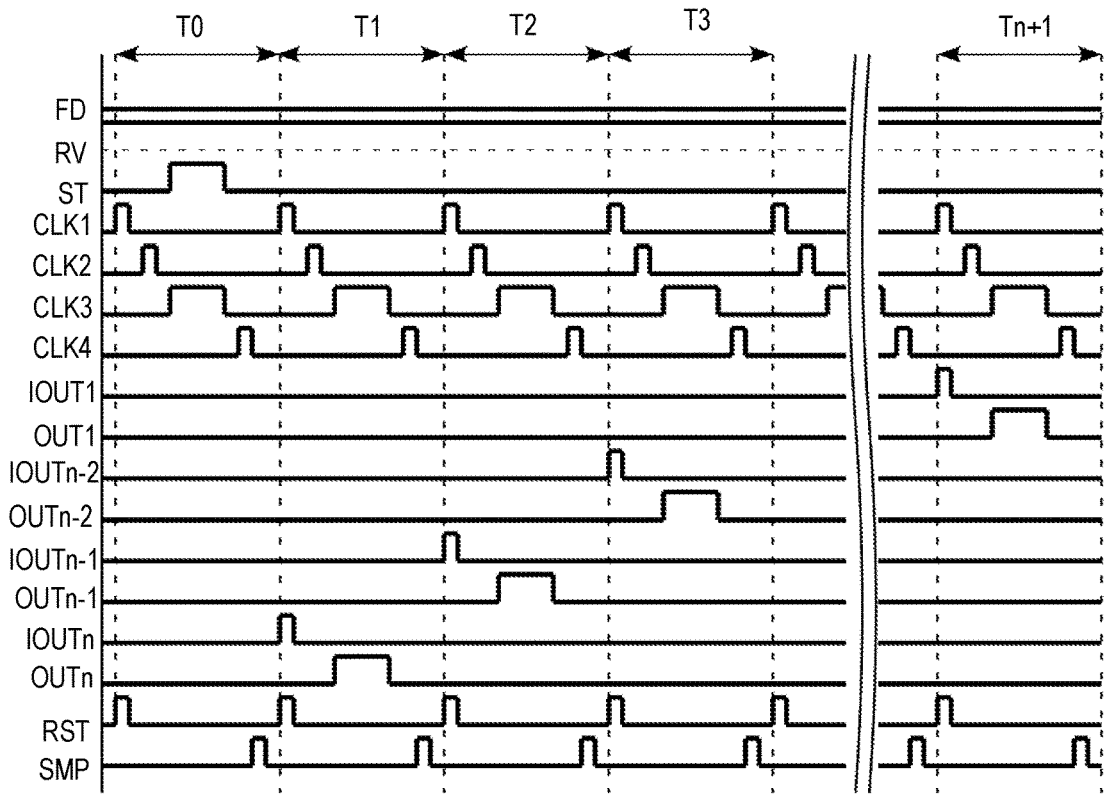
FIG. 18 is a timing chart illustrating operation examples of the scanning circuit that outputs pulses to reverse direction according to Embodiment 4.

FIGS. 17 and 18 are timing charts illustrating operation examples of the scanning circuit 400 in this embodiment. The timing chart of FIG. 17 illustrates an operation example in which pulses are output forward. In the forward operation, each block 500 is supplied with a signal maintaining a high potential (for example, VDD) as the forward signal FD and a signal maintaining a low potential (for example, VSS) as the reverse signal RV.

Accordingly, the transistors 584 becomes conductive and the transistor 583 becomes non-conductive in each block 500, which is equivalent to the state that the internal output signal IOUTi is connected to the output signal OUTi−1. This state is the same as the circuit configuration provided in Embodiment 2; the other operation is the same as the operation in Embodiment 2.

On the other hand, the timing chart of FIG. 18 illustrates an operation example in which pulses are output reversely. In the reverse operation, each block 500 is supplied with a signal maintaining a low potential (for example, VSS) as the forward signal FD and a signal maintaining a high potential (for example, VDD) as the reverse signal RV.

Accordingly, the transistor 584 becomes non-conductive and the transistor 583 becomes conductive in each block 500, which is equivalent to the state where the internal output signal IOUTi is connected to the output signal OUTi+1. That is to say, in this reverse operation, the connection in the forward operation so that the output signal OUTi output from the initial block is connected and transferred to the second block is changed to the connection so that the output signal OUTi output from the final n-th block is connected and transferred to the (n−1)th block.

Accordingly, the circuit operation in each block 500 in the reverse operation is not different from the circuit operation in the forward operation, and the direction to transfer the signals is only reversed. Hence, the pulses of the transfer units are output in the order of the final n-th block, the (n−1)th block, the (n−2)th block, . . . , as illustrated in the timing chart of FIG. 18.

The image sensor 10 in this embodiment provides increased usability like the image sensor 10 in Embodiment 3, in addition to the advantages described in Embodiment 2.

The image sensors 10 in Embodiment 1 to Embodiment 4 can be expressed as follows. The image sensors 10 have a scanning circuit 400 for driving the gate lines of the image sensor and the scanning circuit 400 has a plurality of transfer units (blocks 500) configured to serially output pulses.

Figure 19:
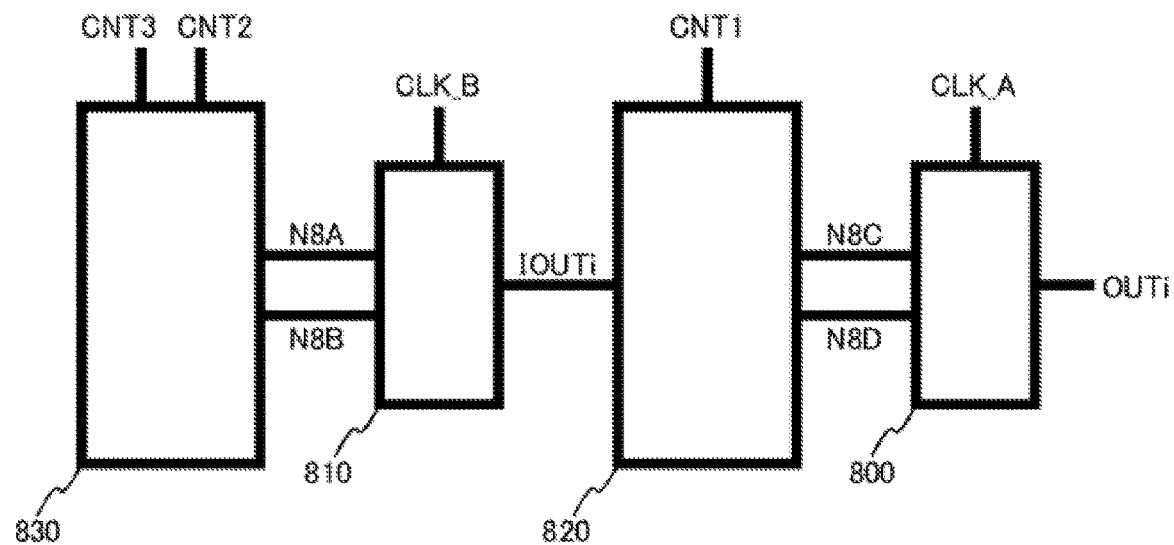
FIG. 19 is a block diagram illustrating function blocks of a transfer unit according to Embodiment 1 to 5.

FIG. 19 is a block diagram illustrating the function blocks of a transfer unit. The transfer unit includes a first output unit 800, a second output unit 810, a first controller 820, and a second controller 830. The first controller 820 controls the potentials of the nodes N8C and N8D for controlling the first output unit 800. The second controller 830 controls the potentials of the nodes N8A and N8B for controlling the second output unit 810.

The first output unit 800 outputs a clock signal CLK_A supplied from the external to the output signal OUTi depending on the potentials of the nodes N8C and N8D. The second output unit 810 outputs a clock signal CLK_B supplied from the external to the internal output signal IOUTi depending on the potentials of the nodes N8A and N8B.

The first controller 820 changes the potentials of the nodes N8C and N8D in accordance with the potential of a control signal CNT1 and the potential of the internal output signal IOUTi from the second output unit 810. The signal CNT1 is a control signal supplied from the external or the output from an adjacent transfer unit.

The second controller 830 changes the potentials of the nodes N8A and N8B in accordance with the potentials of control signals CNT2 and CNT3, which are control signals supplied from the external or the output from an adjacent transfer unit. It is characterized by that the cycles of all clock signals and control signals having a cycle shorter than the period (frame period) for all transfer units to output pulses are equal to a horizontal period for two adjacent transfer units to output pulses.

Embodiment 5

Figure 21:
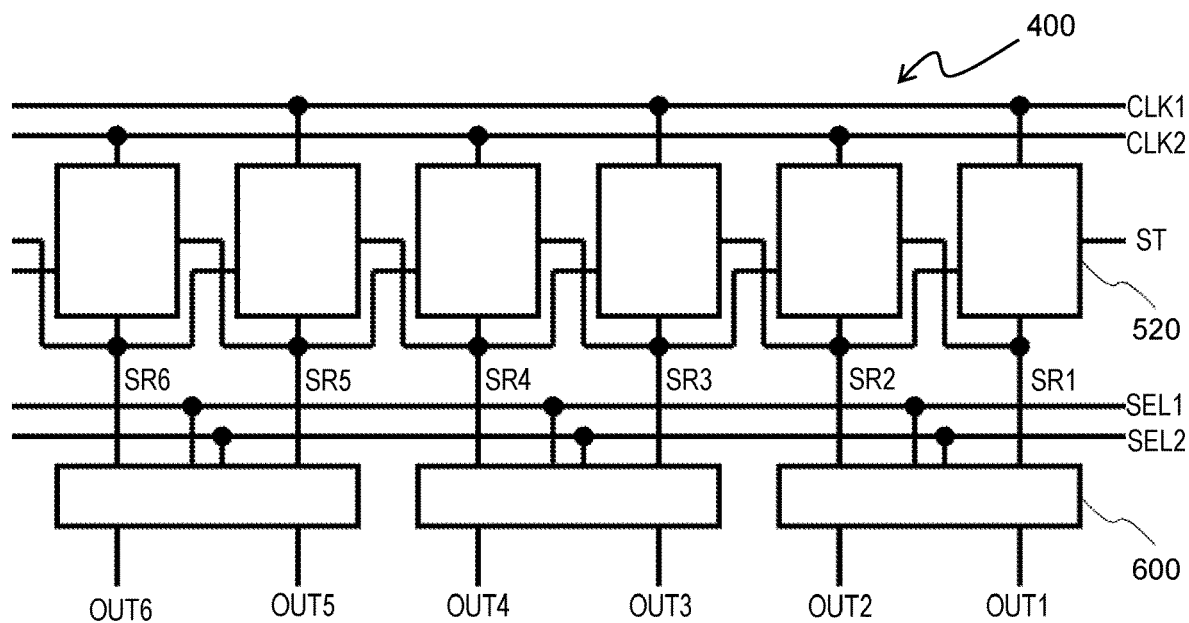
FIG. 21 is a block diagram illustrating a configuration example of the scanning circuit 400 according to Embodiment 5.

The image sensor 10 in this embodiment is different from the image sensor 10 in Embodiment 1 in the scanning circuit 400. Hereinafter, differences from Embodiment 1 are described. FIG. 21 is a block diagram illustrating a configuration example of the scanning circuit 400 in this embodiment. The scanning circuit 400 in this embodiment includes a plurality of transfer units (transfer blocks 520) and a plurality of selection units (selection blocks 600). The transfer blocks 520 are disposed in a line and transfer blocks 520 adjacent to each other are connected. Each transfer block 520 outputs at least one output (one of SR1 to SR6). The transfer blocks 520 are supplied with two different clock signals so that every other transfer block is supplied with the same clock signal.

In the example of FIG. 21, the odd-numbered transfer units are supplied with a clock signal CLK1 and the even-numbered transfer units are supplied with a clock signal CLK2. The number of transfer blocks 520 is larger than the number of gate lines in the image sensor 10.

Each selection block 600 is a selection circuit for selecting one of the outputs of transfer blocks 520 to output the selected output to a gate line. The selection block 600 is connected to two transfer blocks 520 adjacent to each other (the i-th transfer block and the (i+1)th transfer block, where i is an odd number). Hereinafter, the selection block 600 connected to the i-th transfer block and the (i+1)th transfer block is referred to as i-th selection block.

The transfer blocks 520 are controlled in accordance with the two clock signals CLK1 and CLK2 and a start signal supplied from the external. The selection blocks 600 are controlled in accordance with control signals SEL1 and SEL2 supplied from the external.

Figure 22:
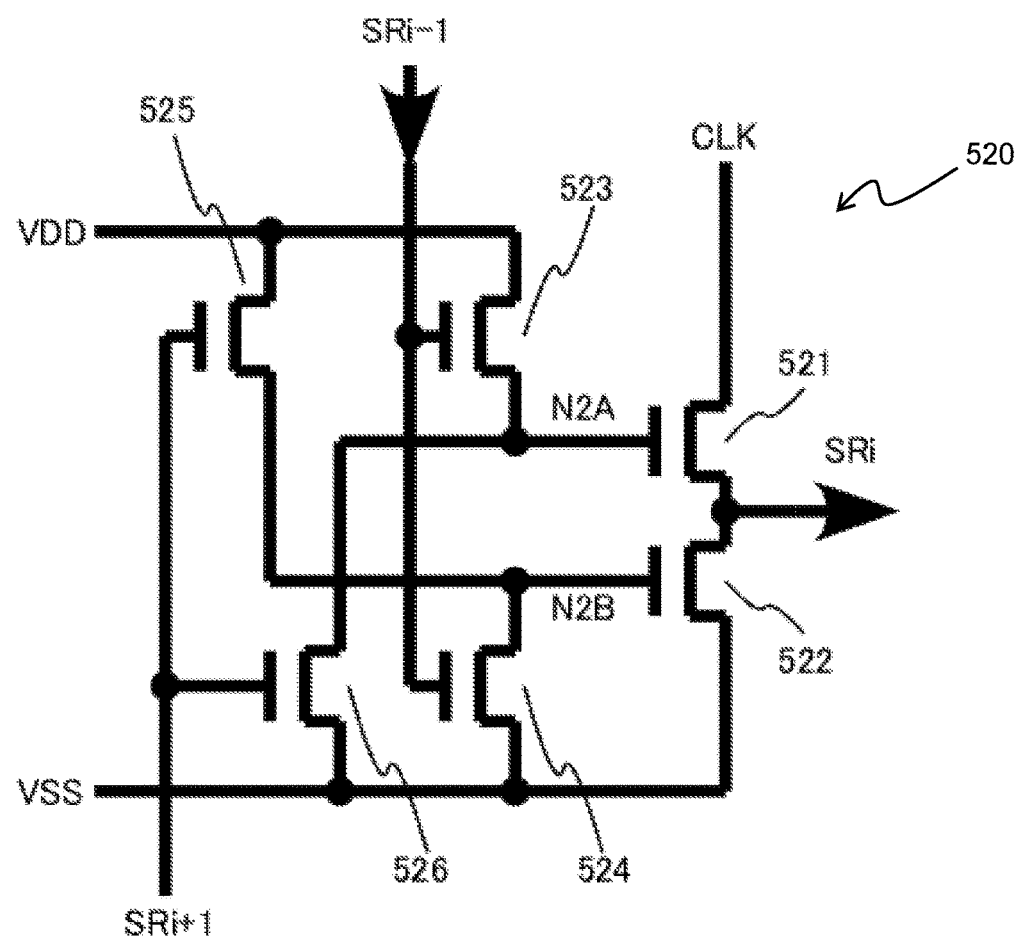
FIG. 22 is a circuit diagram of an example of the circuit configuration of a transfer block in the scanning circuit according to Embodiment 5.

FIG. 22 is a circuit diagram of an example of the circuit configuration of a transfer block (the i-th transfer block) 520 in the scanning circuit 400 in this embodiment. The transfer block 520 includes six transistors, for example. The transfer block 520 is controlled in accordance with the output signal SRi−1 of the previous transfer block, the output signal SRi+1 of the next transfer block, and one of the two clock signals CLK1 and CLK2 supplied from the external.

Figure 23:
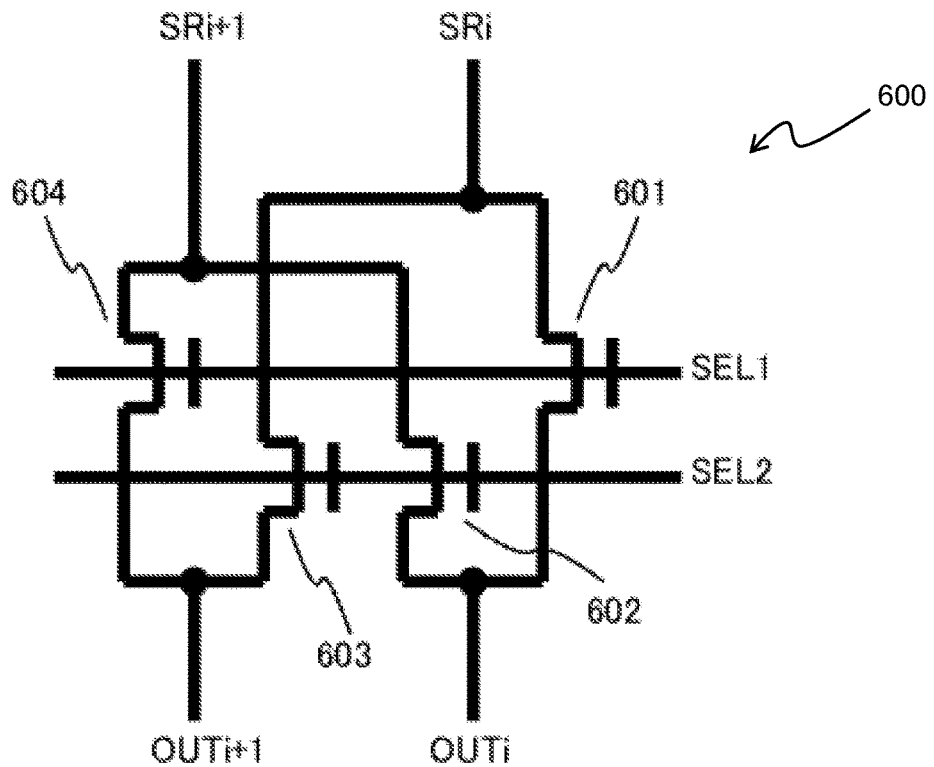
FIG. 23 is a circuit diagram of an example of the circuit configuration of the selection block according to Embodiment 5.

FIG. 23 is a circuit diagram of an example of the circuit configuration of the i-th selection block 600. The selection block 600 includes four transistors, for example. The selection block 600 selects an output signal OUTi or OUTi+1 to output in accordance with the control signals SEL1 and SEL2 for each of the output signals SRi and SRi+1 supplied from the transfer blocks 520. For example, the selection block 600 outputs the output signal SRi+1 to the output signal OUTi+1 in the case of outputting the output signal SRi to the output signal OUTi.

Figure 24:
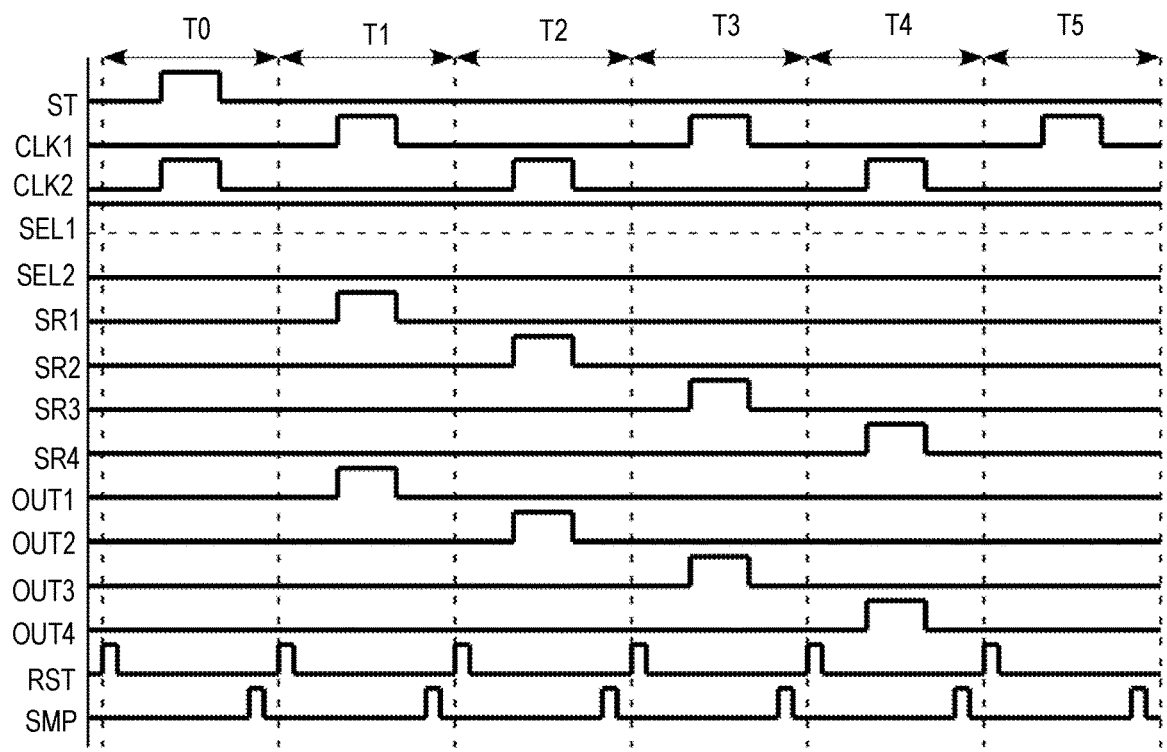
FIG. 24 is a timing chart illustrating operation examples in odd-numbered frames of the scanning circuit according to Embodiment 5.
Figure 25:
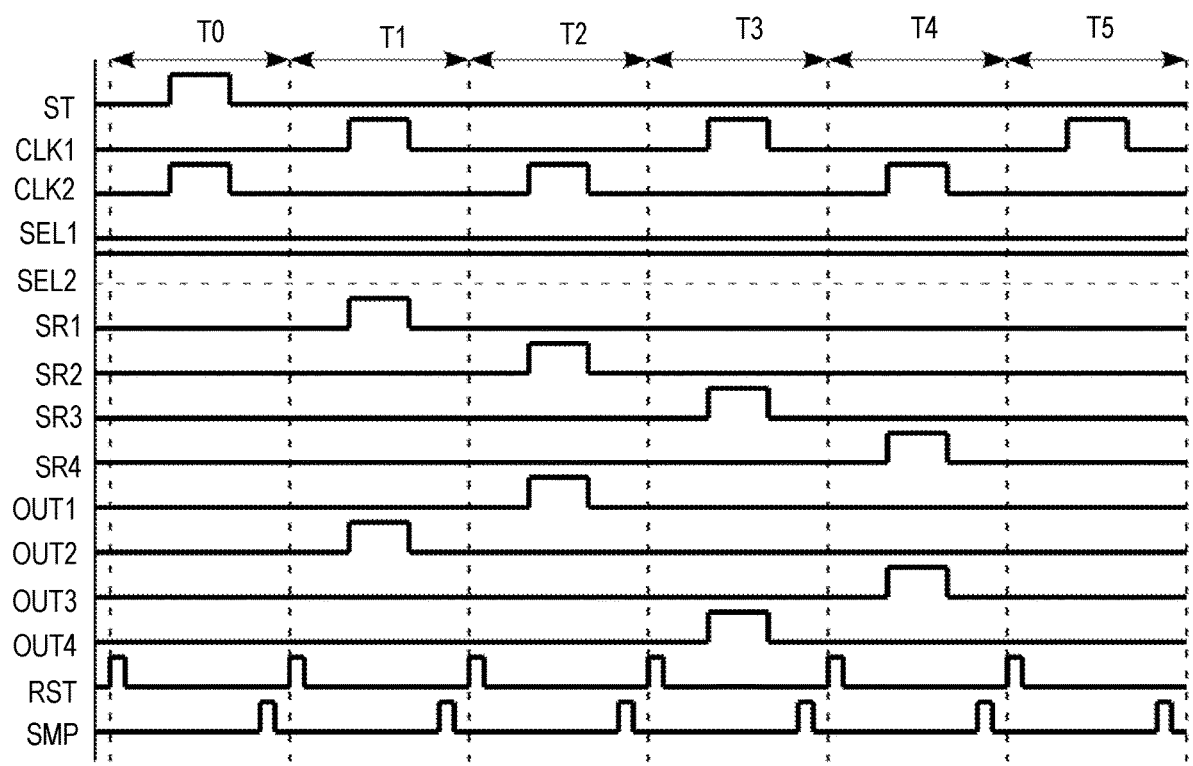
FIG. 25 is a timing chart illustrating operation examples in even-numbered frames of the scanning circuit according to Embodiment 5.

FIGS. 24 and 25 are timing charts illustrating operation examples of the scanning circuit 400 in this embodiment. The image sensor 10 in this embodiment is applicable to taking a motion picture of transmitted X-rays. FIGS. 24 and 25 illustrate an operation example of the scanning circuit 400 in two consecutive frames. In this example, it is assumed that the timing chart of FIG. 24 illustrates the operation in an odd-numbered frame and the timing chart of FIG. 25 illustrates the operation in an even-numbered frame. The clock signal CLK in FIG. 22 corresponds to the clock signal CLK1 in FIGS. 24 and 25 in the odd-numbered transfer units and corresponds to the clock signal CLK2 in FIGS. 24 and 25 in the even-numbered transfer units.

In the period T0, a pulse is output to the start signal ST synchronously with a pulse of the clock signal CLK2. For the initial transfer block, the start signal ST is input to SRi−1 in FIG. 22. Accordingly, when the start signal ST becomes high, the transistors 523 and 524 become conductive; the node N2A is charged to a high potential (a potential close to VDD); the node N2B is charged to a low potential (the potential of VSS); and those potentials are maintained at the nodes after the start signal ST becomes low.

Since the node N2A has a high potential and the node N2B has a low potential, the transistor 521 becomes conductive and the transistor 522 becomes non-conductive. When the clock signal CLK1 becomes high in the period T1, the potential of the output signal SRi increases because the transistor 521 is conductive. Furthermore, the potential of the node N2A increases because of the parasitic capacitance between the source and the gate of the transistor 521, so that the potential of the output signal SRi increases to the potential of VDD.

When the clock signal CLK1 becomes low, the potential of the output signal SRi decreases to VSS. As a result, a pulse like the pulse of the clock signal CLK1 is output to the output signal SRi with a slight delay.

When the clock signal CLK2 becomes high in the period T2, the second transfer block performs the same operation as the operation of the initial transfer block, so that the output signal SRi+1 becomes high. Then, the transistors 525 and 526 become conductive; the node N2A is charged to the potential of VSS; the node N2B is charged to a high potential (a potential close to VDD); and those potentials are maintained at the nodes after the output signal SRi+1 becomes low.

Accordingly, the transistor 521 becomes non-conductive and the transistor 522 becomes conductive, so that the output signal SRi keeps being supplied with the potential of VSS. The foregoing operation is performed in all transfer blocks, so that pulses synchronized with the clock signal CLK1 or CLK2 are serially output from the transfer blocks as illustrated in the timing chart of FIG. 24.

In the odd-numbered frames illustrated in the timing chart of FIG. 24, the control signal SEL1 is high and the control signal SEL2 is low. Accordingly, each selection block 600 outputs the output signal SRi to the output signal OUTi and outputs the output signal SRi+1 to the output signal OUTi+1. That is to say, a pulse synchronized with the clock signal CLK1 is output to the output signal OUT1 in the period T1 and a pulse synchronized with the clock signal CLK2 is output to the output signal OUT2 in the period T2.

As a result, in the period T1, the transistors of the pixels connected to the gate line G1 become conductive and the signals held in the photodiodes are read. In the period T2, the signals of the pixels connected to the gate line G2 are read. Thereafter, the signals of all pixels in the image sensor 10 are read through the same operation.

In the even-numbered frames illustrated in the timing chart of FIG. 25, the control signal SEL1 is low and the control signal SEL2 is high. Accordingly, each selection block 600 outputs the output signal SRi+1 to the output signal OUTi and outputs the output signal SRi to the output signal OUTi+1. Since the control signals and the clock signals other than the control signals SEL1 and SEL2 are the same as those in the timing chart of FIG. 24, the operation of the transfer block 520 is the same as the operation in the odd-numbered frames.

Accordingly, a pulse synchronized with the clock signal CLK1 is output to the output signal OUT2 in the period T1 and a pulse synchronized with the clock signal CLK2 is output to the output signal OUT1 in the period T2. Then, in the period T1, the transistors of the pixels connected to the gate line G2 become conductive and the signals held in the photodiodes are read. In the period T2, the signals of the pixels connected to the gate line G1 are read. Thereafter, the signals of all pixels in the image sensor 10 are read through the same operation. In the even-numbered frames, reading the signals from the image sensor 10 is followed by interchanging the signals read in an odd-numbered horizontal period with the signals read in an even-numbered horizontal period, so that signals for the two dimensions same as those in the odd-numbered frames can be obtained.

Reading the signal charges held in the photodiodes with a detector circuit in the form of voltages can be the same as the operation in Embodiment 1.

The features of the image sensor 10 in this embodiment are summarized as follows. The scanning circuit 400 applicable to the image sensor 10 in this embodiment includes a smaller number of transistors. The times to read the signals from the image sensor 10 are different between odd-numbered frames and even numbered frames. Specifically, in the odd-numbered frames, the signals to be read in the periods T1, T2, T3, and T4 are of the pixel rows of G1, G2, G3, and G4, respectively, and in the even-numbered frames, of the pixel rows of G2, G1, G4, G3, respectively.

However, in both of the odd-numbered and even-numbered frames, pulses are output to the clock signal CLK1 in the periods T1 and T3 and output to the clock signal CLK2 in the periods T2 and T4. That is to say, the clock signal to output a pulse to read the signals from the pixel row of G1 are changed between the clock signal CLK1 in the odd-numbered frames and the clock signal CLK2 in the even numbered frames.

The image sensor 10 in this embodiment significantly reduces the noise originated from the scanning circuit 400, achieving low FPN, improved S/N ratio, and increased dynamic range, like the image sensor in Embodiment 1, although the number of transistors included in the scanning circuit 400 is small. Hereinafter, the reasons for these advantages are described.

As already described, the noise is mixed from the scanning circuit because the voltage-varying control signals are different among the pixel rows to read signals. In the image sensor 10 in this embodiment, the voltage-varying control signals (clock signals) are different between the even-numbered pixel rows and the odd-numbered pixel rows. However, considering two consecutive frames, the noise from the two clock signals are added to the signals of all pixel rows.

Specifically, as to the signals in the pixel row of G1, the noise of the clock signal CLK1 is added in the odd-numbered frames and the noise of the clock signal CLK2 is added in the even-numbered frames. Accordingly, the noise in the signals in all pixel rows can be averaged by averaging the signals in two consecutive frames, so that the noise is not perceived as fixed pattern noise.

This averaging can be performed by a circuit or software. However, in the case where a human observes the signals read from the image sensor 10 as a motion picture, a motion picture time-averaged by the human visual mechanism is recognized. As a result, the fixed pattern noise is not perceived by the observer. The image sensor 10 in this embodiment is also applicable to taking a motion picture of transmitted X-rays, like the other embodiments.

Figure 20:
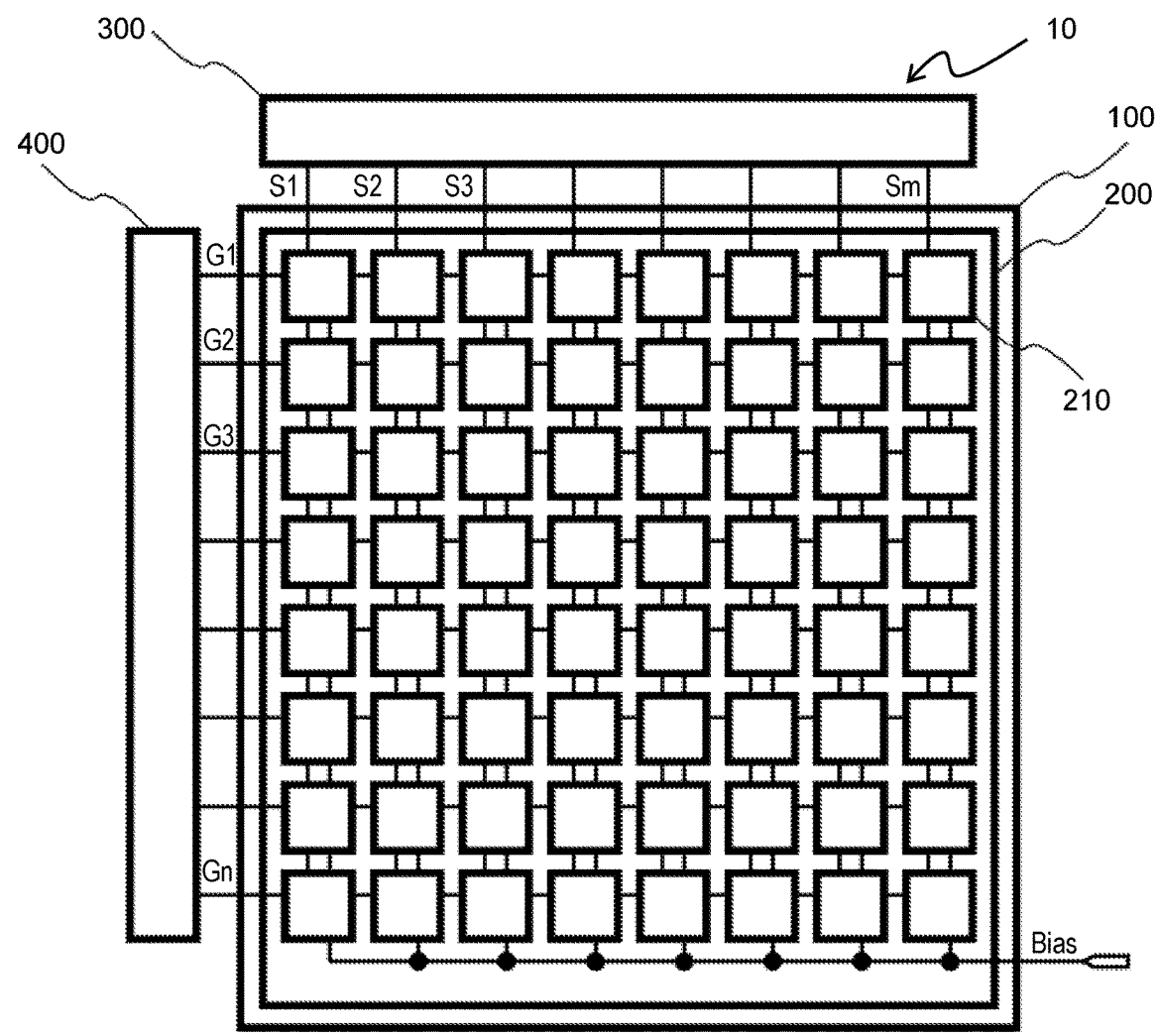
FIG. 20 is a block diagram illustrating another configuration example of the image sensor according to Embodiment 1 to 5.

FIG. 20 is a block diagram illustrating another configuration example of the image sensor 10. The scanning circuits 400 of the image sensors in Embodiments 1 to 5 can be provided on a substrate different from the sensor substrate 100 as illustrated in the block diagram in FIG. 20. The scanning circuit 400 and the sensor substrate 100 can be connected by a cable, for example.

Although the foregoing embodiments have described examples including n-type transistors, p-type transistors can be used by changing the control signals, control clocks, and the voltage supply potentials as appropriate.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An image sensor comprising:
a pixel matrix in which pixels are disposed in a matrix, each pixel including a photoelectric conversion element and a switching element connected to the photoelectric conversion element;
a scanning unit configured to serially perform selection processing on each pixel row of the pixel matrix, the selection processing including selecting a pixel row and outputting an output signal to the selected pixel row to make switching elements conductive; and
a detector unit configured to perform detection processing of detecting signals from the photoelectric conversion elements in the selected pixel row,
wherein the scanning unit is configured to:
receive input of a plurality of control signals; and
perform the selection processing on each pixel row based on the plurality of control signals,
wherein the plurality of control signals include short-cycle control signals having a cycle shorter than a first period in which the selection processing and the detection processing are performed on all pixel rows,
wherein the cycle of the short-cycle control signals is equal to or shorter than a second period in which the selection processing and the detection processing are performed on one pixel row,
wherein the scanning unit includes a plurality of transfer units each connected to a different pixel row to perform the selection processing on the connected pixel row, and
wherein each of the plurality of transfer units is configured to:
receive input of a first short-cycle control signal and a second short-cycle control signal;
output the output signal to the pixel row connected to the transfer unit and one of the transfer units adjacent to the transfer unit;
include a first node, a second node, a third node, and a fourth node;
change potentials of the first node and the second node based on a first control signal to start the initial selection processing or the output signal from another transfer unit;
change potentials of the third node and the fourth node based on the potentials of the first node and the second node and the first short-cycle control signal; and
output the second short-cycle control signal as the output signal based on the potentials of the third node and the fourth node.

2. The image sensor according to claim 1, wherein each of the plurality of transfer units is configured to:
output the first short-cycle control signal as an internal output signal to the other transfer unit of the transfer units adjacent to the transfer unit based on the potentials of the first node and the second node; and
change the potentials of the third node and the fourth node based on the internal output signal from another transfer unit.

3. The image sensor according to claim 1, wherein each of the plurality of transfer units is configured to recharge the first node, the second node, the third node, and the fourth node in the second period for the transfer unit.

4. The image sensor according to claim 1, wherein each of the plurality of transfer units is configured to:
receive input of a second control signal to determine order of selection of pixel rows to perform the selection processing; and
perform the selection processing in accordance with the order of selection specified by the second control signal.

5. The image sensor according to claim 1,
wherein the scanning unit includes a plurality of transfer units each connected to a different pixel row to perform the selection processing on the connected pixel row, and
wherein transistors included in each of the plurality of transfer units are of the same conductivity type.

6. The image sensor according to claim 1, wherein transistors included in each of the plurality of transfer units are oxide semiconductor transistors.

7. A method of driving an image sensor,
the image sensor includes a pixel matrix in which pixels are disposed in a matrix, each pixel including a photoelectric conversion element and a switching element connected to the photoelectric conversion element;

the method comprising:

serially performing selection processing on each pixel row of the pixel matrix, the selection processing including selecting a pixel row and outputting an output signal to the selected pixel row to make switching elements conductive;

performing detection processing of detecting signals from the photoelectric conversion elements in the selected pixel row, receiving input of a plurality of control signals;

performing the selection processing on each pixel row based on the plurality of control signals;

receiving input of a first short-cycle control signal and a second short-cycle control signal;

outputting the output signal to a pixel row;

changing potentials of a first node and a second node based on a first control signal to start the initial selection processing or the output signal;

changing potentials of a third node and a fourth node based on the potentials of the first node and the second node and the first short-cycle control signal; and outputting the second short-cycle control signal as the output signal based on the potentials of the third node and the fourth node, wherein the plurality of control signals include short-cycle control signals having a cycle shorter than a first period in which the selection processing and the detection processing are performed on all pixel rows, and wherein the cycle of the short-cycle control signals is equal to or shorter than a second period in which the selection processing and the detection processing are performed on one pixel row.

* * * * *